United States Patent
Goto et al.

(10) Patent No.: US 7,267,723 B2
(45) Date of Patent: *Sep. 11, 2007

(54) TREATING SOLUTION SUPPLY NOZZLE, A SUBSTRATE TREATING APPARATUS HAVING THIS NOZZLE, AND A METHOD OF MANUFACTURING A TREATING SOLUTION SUPPLY NOZZLE

(75) Inventors: Shigehiro Goto, Kyoto (JP); Hiroshi Kobayashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/836,146

(22) Filed: Apr. 30, 2004

(65) Prior Publication Data

US 2004/0226505 A1    Nov. 18, 2004

(30) Foreign Application Priority Data

| May 13, 2003 | (JP) | ............................. 2003-134288 |
| May 22, 2003 | (JP) | ............................. 2003-144725 |
| May 27, 2003 | (JP) | ............................. 2003-149110 |
| Jul. 22, 2003 | (JP) | ............................. 2003-199960 |

(51) Int. Cl.
  *B05B 7/16*    (2006.01)
  *B05C 11/00*   (2006.01)

(52) U.S. Cl. ...................... 118/302; 118/666; 118/667; 118/323

(58) Field of Classification Search ................. 118/302, 118/666, 667, 323, 52, 612; 239/132.1
See application file for complete search history.

(56) References Cited

U.S. PATENT DOCUMENTS

| 2,114,661 | A | | 4/1938 | West | |
| 5,002,008 | A | * | 3/1991 | Ushijima et al. | ............ 118/313 |
| 5,291,142 | A | * | 3/1994 | Ohmi | ......................... 324/719 |
| 5,871,584 | A | * | 2/1999 | Tateyama et al. | ............ 118/323 |
| 5,952,050 | A | * | 9/1999 | Doan | .......................... 427/336 |
| 6,170,709 | B1 | | 1/2001 | Huang | ...................... 222/146.5 |
| 6,239,038 | B1 | * | 5/2001 | Wen | ............................ 438/745 |

(Continued)

FOREIGN PATENT DOCUMENTS

DE         20004283 U1      6/2000

(Continued)

*Primary Examiner*—Yewebdar Tadesse
(74) *Attorney, Agent, or Firm*—Ostrolenk, Faber, Gerb & Soffen, LLP

(57) ABSTRACT

A resin block has a treating solution channel extending between and opening at front and back surfaces thereof. Heat conductive members are face-bonded to the front and back surfaces of the resin block, respectively, for closing the channel. Consequently, no air is present between the resin block and heat conduction members, thereby improving the efficiency of heat exchange. A nozzle of simple construction is realized only by face-bonding the two heat conductive members to the open front and rear surfaces of the resin block. Temperature control plates hold the heat conductive members along with the resin block to effect a temperature control, whereby the temperature of a treating solution in the treating solution channel is controlled effectively through the heat conductive members. The treating solution adjusted to a desired temperature is delivered from a discharge opening to a substrate for performing substrate treatment with high accuracy.

43 Claims, 28 Drawing Sheets

U.S. PATENT DOCUMENTS

| | | | |
|---|---|---|---|
| 6,827,782 B2* | 12/2004 | Goto et al. | 118/667 |
| 2001/0003966 A1* | 6/2001 | Kitano et al. | 118/70 |
| 2003/0141314 A1 | 7/2003 | Goto et al. | 221/135 |

FOREIGN PATENT DOCUMENTS

| | | |
|---|---|---|
| EP | 0475224 A2 | 3/1992 |
| EP | 0486242 A1 | 5/1992 |
| FR | 1.115.928 | 5/1956 |
| FR | 2495024 | 6/1982 |
| JP | 06-291027 | 10/1994 |
| JP | 07-263326 | 10/1995 |
| JP | 10-256127 | 9/1998 |

* cited by examiner

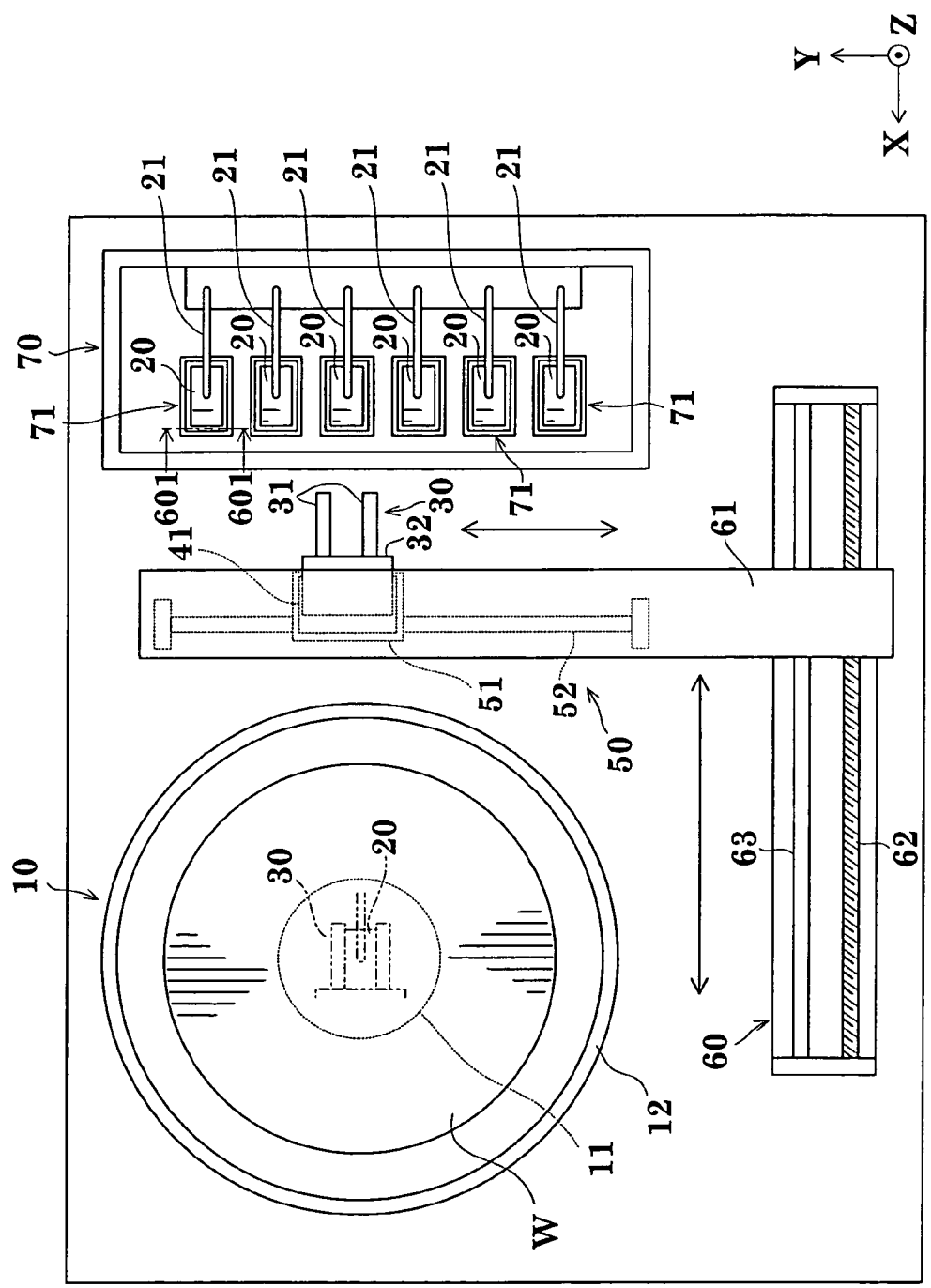

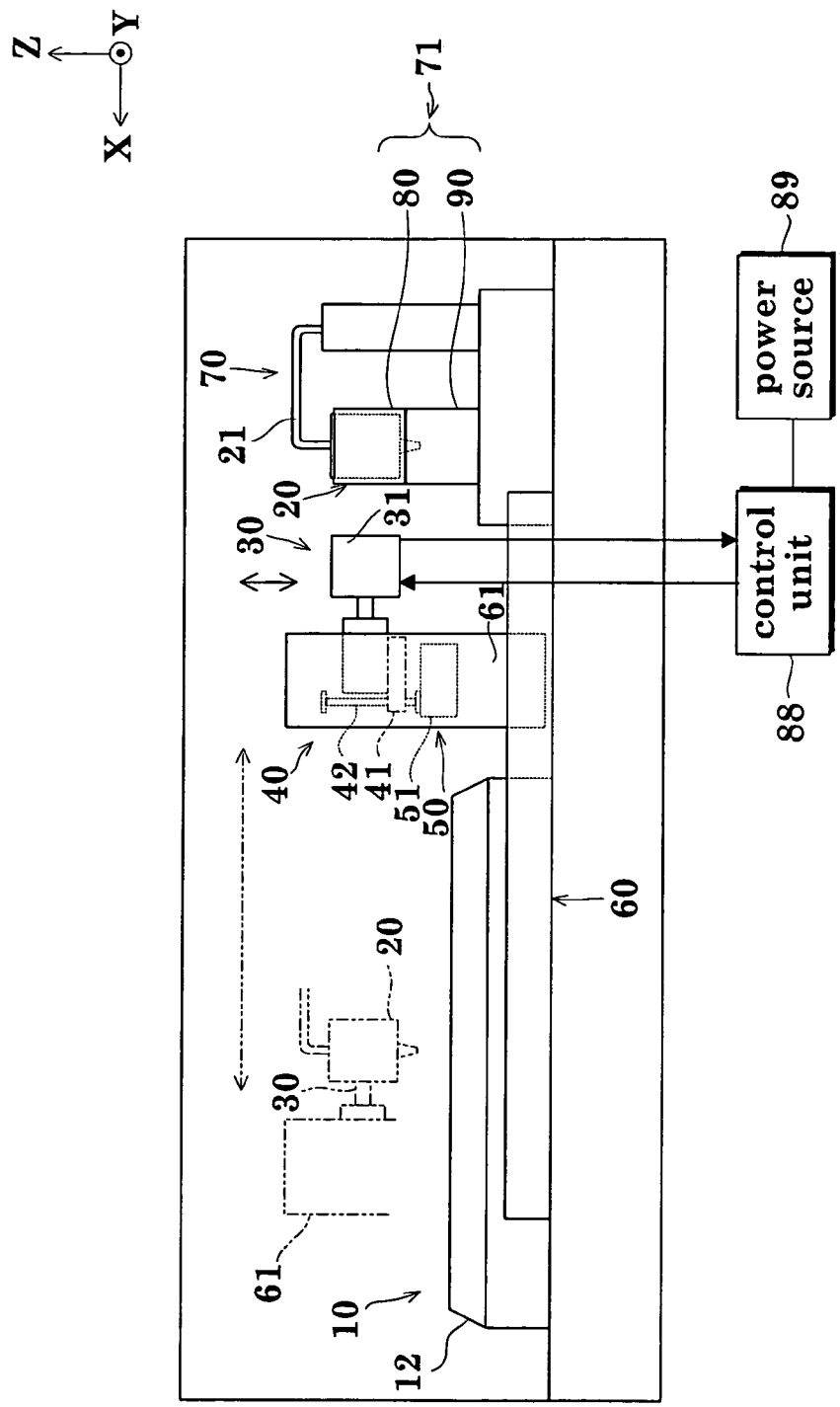

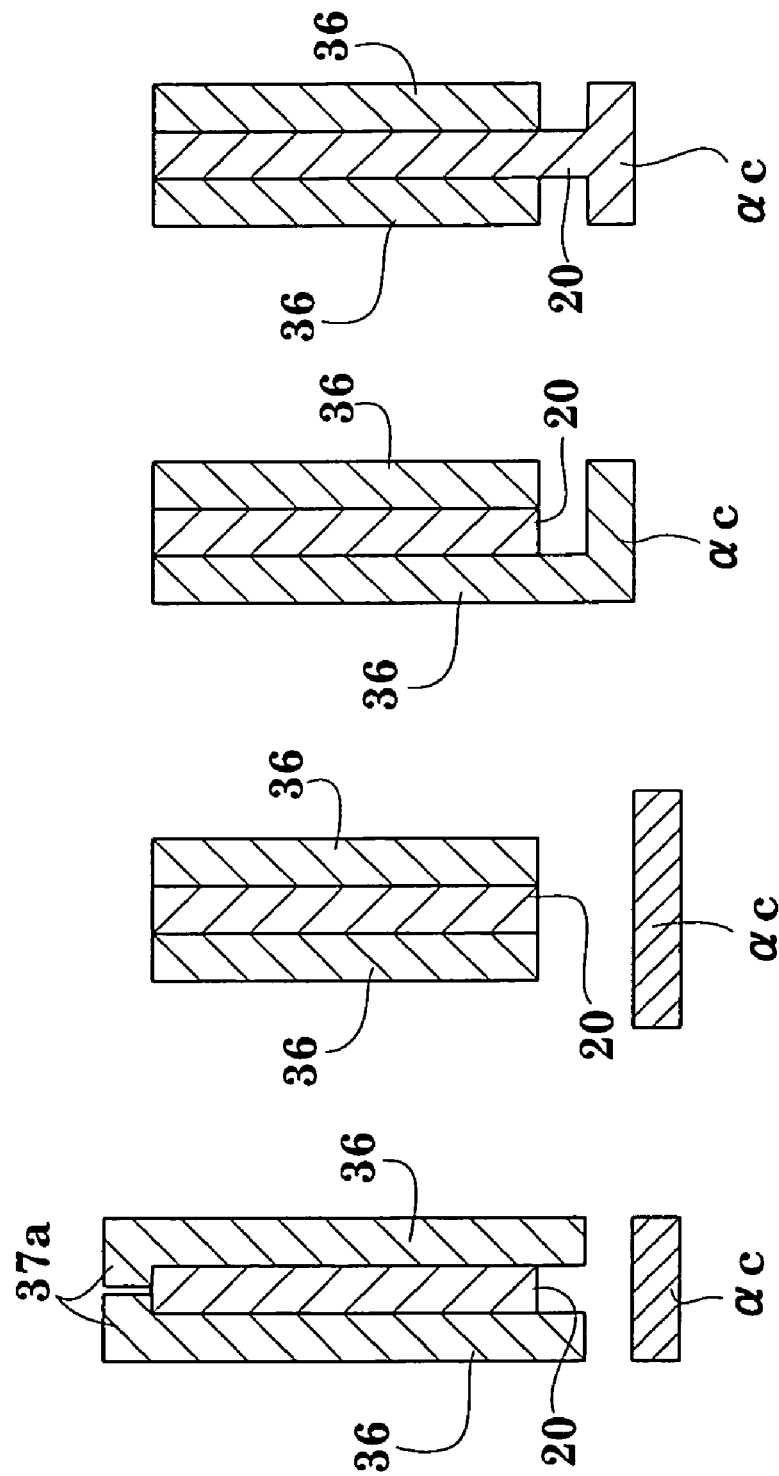

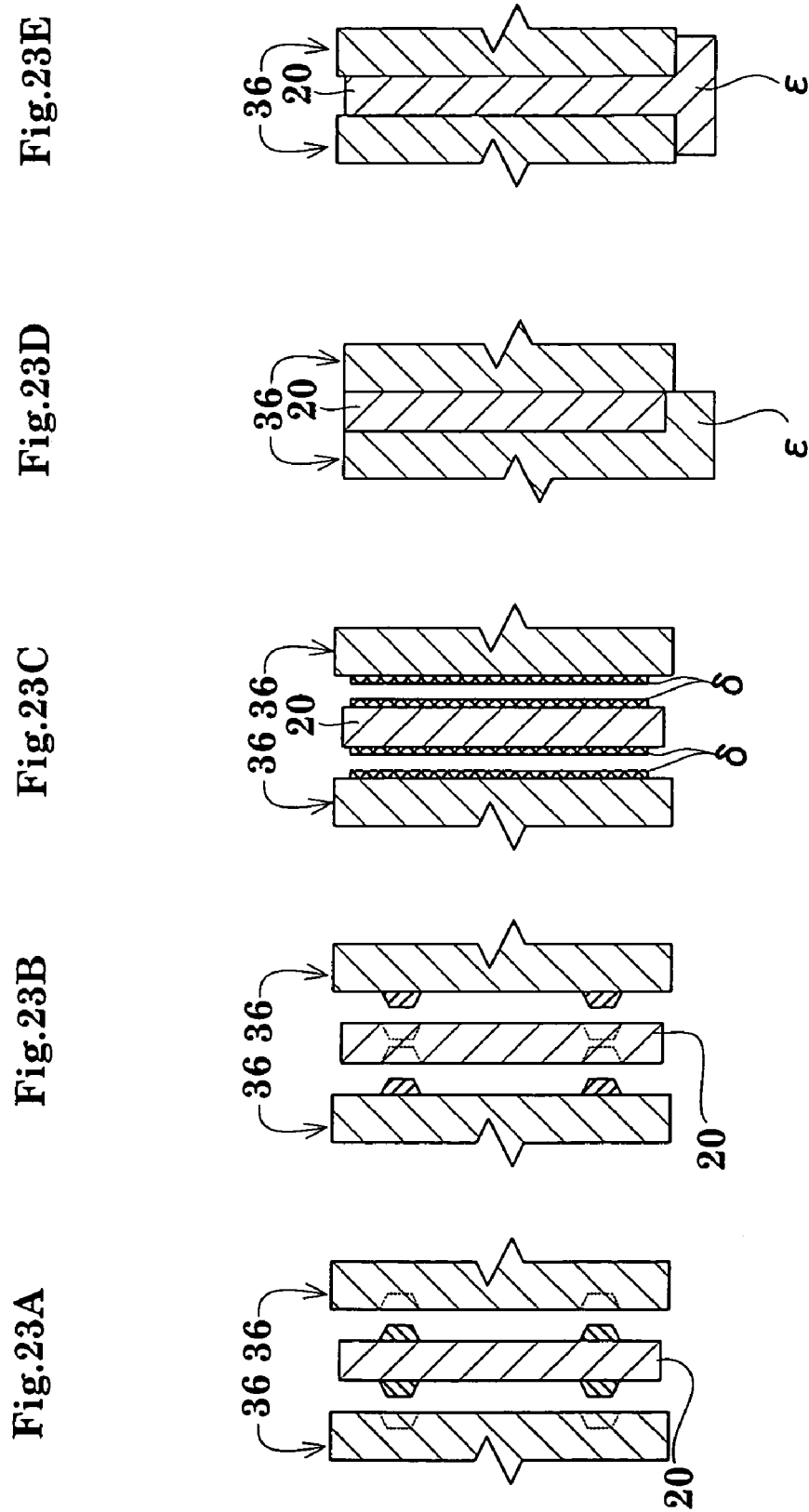

Fig.28A
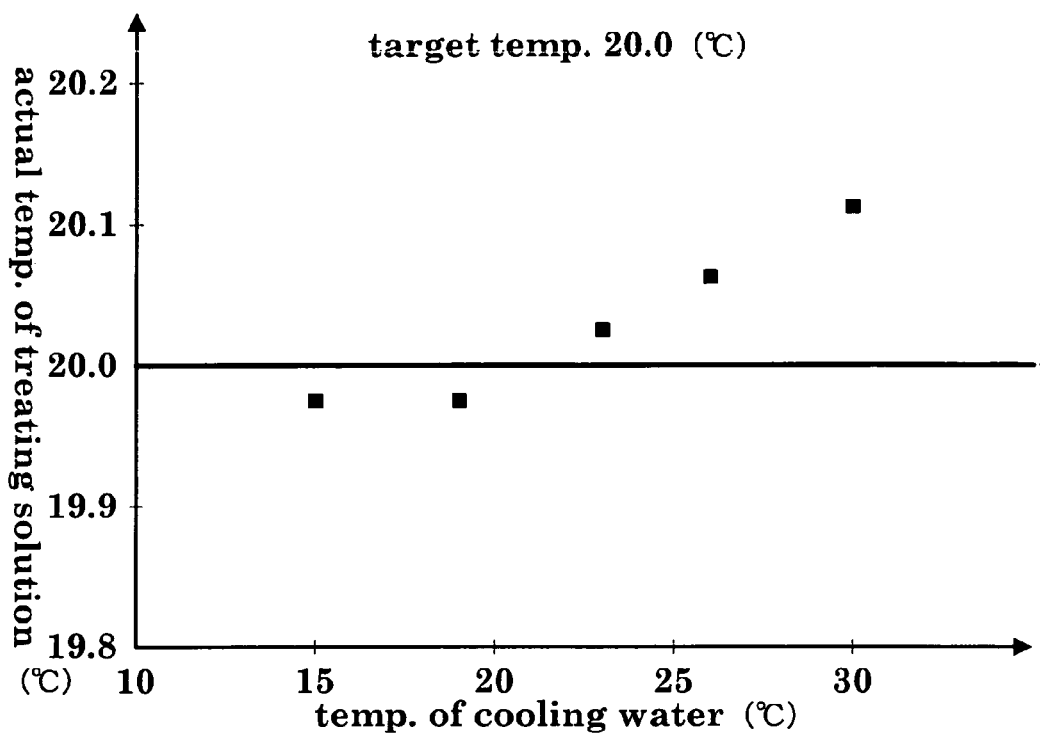
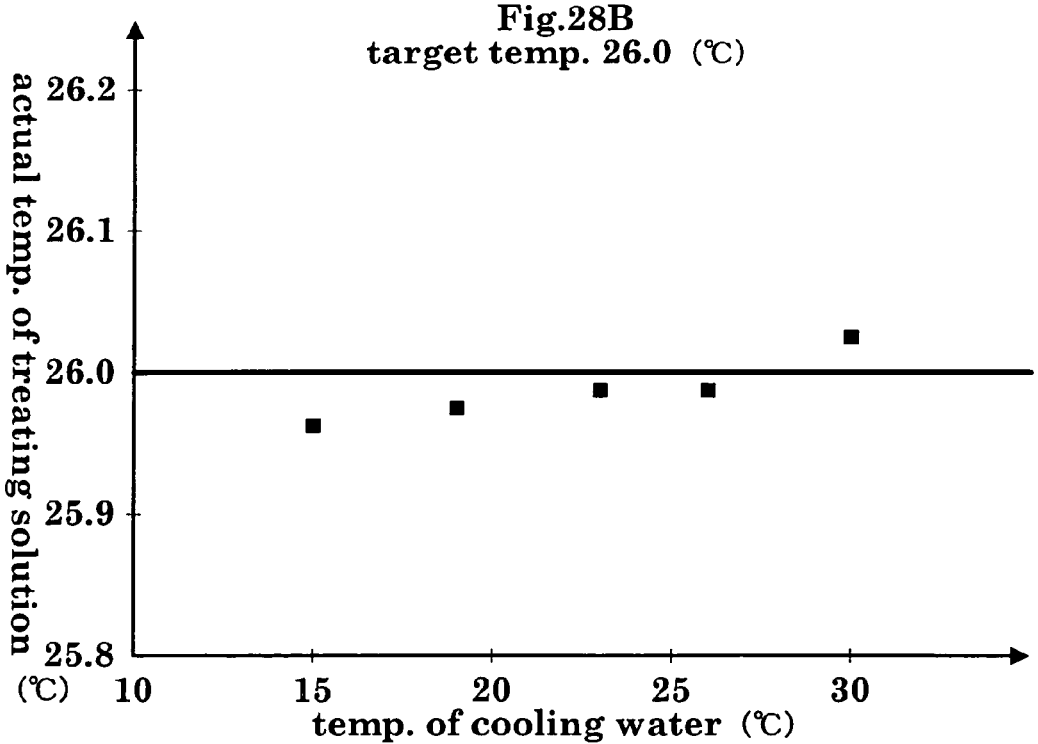

TREATING SOLUTION SUPPLY NOZZLE, A SUBSTRATE TREATING APPARATUS HAVING THIS NOZZLE, AND A METHOD OF MANUFACTURING A TREATING SOLUTION SUPPLY NOZZLE

BACKGROUND OF THE INVENTION (1) Field of the Invention

This invention relates to a treating solution supply nozzle for supplying a treating solution to semiconductor substrates, glass substrates for liquid crystal displays, glass substrates for photomasks, or substrates for optical disks (hereinafter simply called substrates), a substrate treating apparatus having this nozzle, and a method of manufacturing a treating solution supply nozzle. More particularly, the invention relates to a technique for controlling the temperature of a treating solution in a treating solution supply nozzle held in a sandwiched state.

(2) Description of the Related Art

In a conventional technique for controlling the temperature of a treating solution in a treating solution supply nozzle, a double pipe construction is known in which a temperature control pipe is disposed to surround a treating solution pipe connected to the nozzle. Japanese Unexamined Patent Publication No. 6-291027 (1994) discloses a nozzle that delivers a treating solution from a treating solution pipe under temperature control by constant temperature water in a temperature control pipe.

In view of a treating solution pipe having to be changed because of a fault or the like, Japanese Unexamined Patent Publication No. 7-263326 (1995) discloses a construction in which a temperature control chamber includes a temperature control pipe having a treating solution pipe removably inserted therein, and constant temperature water is circulated through a sealed space formed between the inner wall of the temperature control chamber and the outer wall of the temperature control pipe.

However, such double pipe construction requires the temperature control pipe to have a large diameter, which does not allow the temperature control pipe a large curvature in time of nozzle movement. Thus, a large space is required in the vertical direction which is perpendicular to a substrate under treatment. This poses a problem that the apparatus cannot be made compact in the vertical direction.

To solve this problem, a technique as shown in FIG. 1 has been proposed. According to this technique, a nozzle 102 having a plate-like solution reservoir 101 is pinched between two temperature control plates 103 in a horizontal direction to control the temperature of a treating solution in the nozzle 102. This realizes a compact apparatus.

Each temperature control plate 103 has a Peltier element (not shown) acting as thermoelectric cooling element, and a cooling water circulating member (not shown) for supplying cooling water to remove heat generating from the Peltier element. Each cooling water circulating member includes a cooling water pipe mounted therein for passing cooling water. The cooling water pipe extends outside to be connected to a cooling water feeder disposed outside. Cooling water is circulated from the cooling water feeder through the cooling water circulating member of the temperature control plate 103.

As shown in FIG. 2, the solution reservoir 101 is in the form of meandering pipe 104 to have a large surface area per volume and define a winding treating solution channel. The treating solution is stored in the meandering pipe 104 at least in a quantity to be used in a next delivery cycle. The solution reservoir 101 has a projection 105 formed at the lower end thereof and connected to the meandering pipe 104. A discharge opening 105a is formed at the tip of the projection 105 for delivering the treating solution.

The internal structure of the nozzle 102 will be described in detail by referring to FIGS. 3A through 3D. FIG. 3A is a section of the nozzle 102 taken on line 604-604 of FIG. 2. FIG. 3B is a side view of the nozzle 102. FIG. 3C is a bottom view of the nozzle 102. FIG. 3D is a section of the nozzle 102 taken on line 605-605 of FIG. 3A. In manufacturing the nozzle 102, as shown in FIGS. 3A and 3D, the meandering pipe 104 is formed by bending a tube having a circular cross section, and is covered by a housing 106. Surfaces of the housing 106 that contact the temperature control plates 103 are formed of a heat conducting material (e.g. aluminum, copper, stainless steel or carbon) to ensure a reliable temperature control.

As shown in FIG. 3D, air layers 107 are formed between the meandering piping 104 and housing 106 to act as heat insulation layers that lower the efficiency of heat exchange with the treating solution. It is conceivable to improve the efficiency of heat exchange by filling the air layers 107 with a high heat conductive filler (e.g. metal paste) which is a highly heat conductive material, or by flattening the meandering pipe 104 to diminish the air layers 107. However, such filling or flattening step takes time and trouble. When the nozzle 102 with such a low efficiency of heat exchange is used in substrate treatment, the treating solution set to a desired temperature is not supplied to the substrate. The substrate treatment cannot be performed accurately.

SUMMARY OF THE INVENTION

This invention has been made having regard to the state of the art noted above, and its object is to provide a treating solution supply nozzle simple in construction and capable of improving the efficiency of heat exchange to enable accurate substrate treatment, and to provide also a substrate treating apparatus having this nozzle, and a method of manufacturing a treating solution supply nozzle.

The above object is fulfilled, according to this invention, by a treating solution supply nozzle for supplying a treating solution to a substrate, comprising:

a block member having a channel formed therein for passage of the treating solution, the channel being open at least at one lateral surface of the block member;

a heat conductive member face-bonded to the lateral surface of the block member for closing the channel;

a supply port communicating with the channel for supplying the treating solution into the channel; and a discharge port communicating with the channel for delivering the treating solution from the channel to the substrate.

The treating solution supply nozzle according to this invention includes a block member having a channel formed therein for passage of the treating solution, the channel being open at least at one lateral surface of the block member, a heat conductive member face-bonded to the lateral surface of the block member for closing the channel, a supply port communicating with the channel for supplying the treating solution into the channel, and a discharge port communicating with the channel for delivering the treating solution from the channel to the substrate. The channel opening at least at one lateral surface of the block member is closed by the heat conductive member face-bonded to the lateral surface of the block member. The heat conductive member is face-bonded in direct contact to the open lateral surface of the block member. That is, no air is present between the block member and heat conductive member, thereby improving the efficiency of heat exchange. The treating solution supply nozzle is formed only by face-bonding the heat conductive member to the open surface of the block member. Thus, the treating solution supply nozzle is simple in construction.

A treating solution supply nozzle according to this invention different from the above treating solution supply nozzle for supplying a treating solution to a substrate, comprises:

a block member having a channel formed therein for passage of the treating solution, the channel extending between and opening at front and back surfaces of the block member;

heat conductive members face-bonded to the front and back surfaces of the block member, respectively, for closing the channel;

a supply port communicating with the channel for supplying the treating solution into the channel; and a discharge port communicating with the channel for delivering the treating solution from the channel to the substrate.

The treating solution supply nozzle according to this invention includes a block member having a channel formed therein for passage of the treating solution, the channel extending between and opening at front and back surfaces of the block member, heat conductive members face-bonded to the front and back surfaces of the block member, respectively, for closing the channel, a supply port communicating with the channel for supplying the treating solution into the channel, and a discharge port communicating with the channel for delivering the treating solution from the channel to the substrate. The channel extending between and opening at the front and back surfaces of the block member is closed by the heat conductive members face-bonded to the front and back surfaces of the block member. The heat conductive members are face-bonded in direct contact to the open front and back surfaces of the block member. That is, no air is present between the block member and heat conductive members, thereby improving the efficiency of heat exchange. The treating solution supply nozzle is formed only by face-bonding the heat conductive members to the open front and back surfaces of the block member. Thus, the treating solution supply nozzle is simple in construction.

The above treating solution supply nozzles, preferably, have the following channel, for example. That is, the channel is formed to direct the treating solution supplied from the supply port into the block member, to a lower position, then to an upper position higher than the lower position, and again downward to be delivered from the discharge port. This construction can supply the treating solution stably while reliably avoiding the possibility of air entering the channel.

Preferably, a chemical-resistant resin is disposed between the block member and heat conductive member or members. This construction is effective for keeping the treating solution free from contamination and particles resulting from a direct contact between the treating solution and heat conductive member or members. Consequently, the clean treating solution may be supplied to the substrate.

In another aspect of the invention, a substrate treating apparatus is provided for treating a substrate by supplying a treating solution thereto, the apparatus comprising:

a treating solution supply nozzle for supplying the treating solution to the substrate; and temperature control devices for holding the treating solution supply nozzle to control temperature of the treating solution in the nozzle;

the nozzle including:

a block member having a channel formed therein for passage of the treating solution, the channel being open at least at one lateral surface of the block member;

a heat conductive member face-bonded to the lateral surface of the block member for closing the channel;

a supply port communicating with the channel for supplying the treating solution into the channel; and a discharge port communicating with the channel for delivering the treating solution from the channel to the substrate.

In the substrate treating apparatus according to this invention, the temperature control devices pinch therebetween the block member and the heat conductive member face-bonded to the at least one open lateral surface of the block member. Thus, the temperature of the treating solution in the channel may be controlled effectively through the heat conductive member. The treating solution adjusted to a desired temperature is delivered from the discharge port of the treating solution supply nozzle to the substrate, to treat the substrate with high accuracy.

A substrate treating apparatus according to this invention different from the above substrate treating apparatus for treating a substrate by supplying a treating solution thereto, comprises:

a treating solution supply nozzle for supplying the treating solution to the substrate; and temperature control devices for holding the treating solution supply nozzle to control temperature of the treating solution in the nozzle;

the nozzle including:

a block member having a channel formed therein for passage of the treating solution, the channel extending between and opening at front and back surfaces of the block member;

heat conductive members face-bonded to the front and back surfaces of the block member, respectively, for closing the channel;

a supply port communicating with the channel for supplying the treating solution into the channel; and a discharge port communicating with the channel for delivering the treating solution from the channel to the substrate.

In the substrate treating apparatus according to this invention, the temperature control devices pinch therebetween the block member and the heat conductive members face-bonded to the open front and back surfaces of the block member. Thus, the temperature of the treating solution in the channel may be controlled effectively through the heat conductive members. The treating solution adjusted to a desired temperature is delivered from the discharge port of the treating solution supply nozzle to the substrate, to treat the substrate with high accuracy.

Preferably, these substrate treating apparatus described above further include devices for solving problems (I) to (III) set out hereunder:

Regarding Problem (I)

In FIG. 1, when the temperature control plates 103 pinch the nozzle 102 therebetween, dust may generate from the contact surfaces of the temperature control plates 103 and the solution reservoir 101 of nozzle 102. The dust may adhere to substrates to cause inconveniences such as a defect.

The invention described below has been made to overcome such an inconvenience, and its object is to provide (I) a substrate treating apparatus for performing accurate substrate treatment.

A substrate treating apparatus according to this invention for solving problem (I) comprises, besides the temperature control devices, block member, heat conductive member, supply port and discharge port noted hereinbefore, a receiving portion for receiving dust generating from contact surfaces of the treating solution supply nozzle and the temperature control devices.

According to the substrate treating apparatus of this invention, the receiving portion receives the dust generating from the contact surfaces of the treating solution supply nozzle and temperature control devices. With the receiving portion receiving the dust, the dust has a reduced chance of adhering to the substrate. This reduction of dust allows substrate treatment to be performed with high accuracy.

In the above substrate treating apparatus according to this invention, examples of construction of the treating solution supply nozzle, temperature control devices and receiving portion include the receiving portion being formed integral with the treating solution supply nozzle or the temperature control devices, and the receiving portion being spaced from the treating solution supply nozzle and the temperature control devices. The term "being formed integral" herein refers to the receiving portion forming part of the treating solution supply nozzle or the temperature control devices.

Preferably, the receiving portion is constructed to surround peripheries of the treating solution supply nozzle. With this construction, the dust generating from the contact surfaces of the treating solution supply nozzle and temperature control devices is prevented from scattering also otherwise than downward, e.g. from scattering sideways. Further, by surrounding the peripheries of the treating solution supply nozzle, external atmosphere may be shielded off reliably. This realizes an increased accuracy of temperature control of the treating solution in the nozzle.

Preferably, at least the treating solution supply nozzle or the temperature control devices include(s) exhaust outlets for exhausting spaces formed by the treating solution supply nozzle and the temperature control devices. The exhaust outlets provided for at least the treating solution supply nozzle or the temperature control devices serve to exhaust and remove the dust generating from the contact surfaces of the treating solution supply nozzle and temperature control devices and present in the spaces formed therebetween. Thus, the dust generating from the contact surfaces of the treating solution supply nozzle and temperature control devices is reliably prevented from falling and adhering to the substrate and so on.

The exhaust outlets may, for example, be arranged below the contact surfaces, extending vertically, of the treating solution supply nozzle and the temperature control devices. With this arrangement, the exhaust outlets arranged below the contact surfaces, extending vertically, of the treating solution supply nozzle and the temperature control devices serve to exhaust and remove the dust generating and falling from the contact surfaces of the treating solution supply nozzle and temperature control devices. Thus, the dust generating and falling from the contact surfaces of the treating solution supply nozzle and temperature control devices may be exhausted and removed with increased effect.

Preferably, the receiving portion is disposed at least below the contact surfaces, extending vertically, of the treating solution supply nozzle and the temperature control devices. With this arrangement, the receiving portion disposed at least below the contact surfaces, extending vertically, of the treating solution supply nozzle and the temperature control devices receives the dust generating and falling from the contact surfaces of the treating solution supply nozzle and temperature control devices. Thus, the dust generating from the contact surfaces of the treating solution supply nozzle and temperature control devices is reliably prevented from falling and adhering to the substrate.

Regarding Problem (II)

In FIG. 1, when the temperature control plates 103 pinch the nozzle 102 therebetween, with an inappropriate relative position between the nozzle 102 and temperature control plates 103, the nozzle 102 will have a reduced area for heat exchange with the temperature control plates 103 to lower the efficiency of heat exchange. Although temperature sensors are provided for the nozzle 102 and temperature control plates 103, the above inappropriate relative position lowers the accuracy of temperature control also. With the low efficiency of heat exchange and the low accuracy of temperature control, the treating solution cannot be supplied at a desired temperature to the substrate for accurate substrate treatment.

The invention described below has been made to overcome such an inconvenience, and its object is to provide (II) a substrate treating apparatus for performing accurate substrate treatment.

A substrate treating apparatus according to this invention for solving problem (II) comprises, besides the temperature control devices, block member, heat conductive member, supply port and discharge port noted hereinbefore, a positioning mechanism for determining a relative position between the treating solution supply nozzle and the temperature control devices.

According to the substrate treating apparatus of this invention, the positioning mechanism for determining a relative position between the treating solution supply nozzle and the temperature control devices effectively reduces the chance of displacement of the treating solution supply nozzle and the temperature control devices relative to each other.

This is effective to improve the efficiency of heat exchange and the accuracy of temperature control. The treating solution may be supplied at a desired temperature to the substrate for accurate substrate treatment.

In the above substrate treating apparatus according to this invention, one example of the positioning mechanism is a mating device for joining the treating solution supply nozzle and the temperature control devices, the mating device including recesses formed in the treating solution supply nozzle or the temperature control devices, and projections formed in the other of the treating solution supply nozzle and the temperature control devices. With the mating device joining the treating solution supply nozzle and the temperature control devices as noted above, a relative position between the treating solution supply nozzle and the temperature control devices is determined.

In another example of the positioning mechanism, two members having magnetic attraction are provided, one of the members being disposed on the treating solution supply nozzle, and the other member on the temperature control devices. With this arrangement, when the temperature control devices hold the treating solution supply nozzle, one member and the other member stick to each other through magnetic attraction. This determines a relative position between the treating solution supply nozzle and temperature control devices.

The term "members having magnetic attraction are provided" herein refers not only to providing the members having magnetic attraction for the treating solution supply nozzle and temperature control devices, but also to forming the treating solution supply nozzle or temperature control devices integrally with a member having magnetic attraction, that is a member having magnetic attraction forms part of the treating solution supply nozzle or temperature control devices. One of the members having magnetic attraction may be a magnetic material, typically iron, with the other being a magnet. Both members may be magnets.

A further example of the positioning mechanism is an extension disposed below contact surfaces of the treating solution supply nozzle and the temperature control devices. This extension supports the treating solution supply nozzle or temperature control devices from below to determine a relative position between the treating solution supply nozzle and temperature control devices. The extension may be provided for either the treating solution supply nozzle or the temperature control devices. Where the extension is provided for the treating solution supply nozzle, the extension supports the temperature control devices from below. Where the extension is provided for the temperature control devices, the extension supports the treating solution supply nozzle from below. In this way, a relative position is determined.

The extension provided receives the dust generating from the contact surfaces noted above. This feature has an additional advantage of reducing the chance of the dust adhering to the substrate and so on, thereby performing substrate treatment with high accuracy.

Regarding Problem (III)

In FIG. 1, the cooling water flowing in circulation as noted hereinbefore causes a temperature difference between the upstream and downstream temperature control plates 103. That is, the cooling water undergoes temperature changes by the influence of the Peltier element disposed at the upstream side, and the cooling water having changed in temperature is supplied to the cooling water circulating member at the downstream side. The cooling water thus causes a temperature difference between the upstream and downstream Peltier elements, and further also between the temperature control plates 103. The temperature of the cooling water changes also while the water flows from the upstream side to the downstream side, thereby similarly causing a temperature difference between the temperature control plates 103. As a result, it is difficult to control the temperature of the treating solution with high accuracy.

The invention described below has been made to overcome such an inconvenience, and its object is to provide (III) a substrate treating apparatus for controlling the temperature of the treating solution with high accuracy.

A substrate treating apparatus according to this invention for solving problem (III) comprises the temperature control devices, block member, heat conductive member, supply port and discharge port noted hereinbefore, wherein each temperature control device includes:

a temperature control member disposed adjacent or in contact with the nozzle;

a thermoelectric cooling element for setting the temperature control member to a predetermined temperature by thermoelectric cooling effect; and a cooling member having a coolant passage for receiving a coolant for removing heat generating from the thermoelectric cooling element;

the coolant being supplied in parallel to the cooling members of the temperature control devices.

According to the substrate treating apparatus of this invention, each temperature control device includes a temperature control member disposed adjacent or in contact with the nozzle, a thermoelectric cooling element for setting the temperature control member to a predetermined temperature by thermoelectric cooling effect, and a cooling member having a coolant passage for receiving a coolant for removing heat generating from the thermoelectric cooling element. The coolant is supplied in parallel to the cooling members of the temperature control devices, whereby a thermal influence is given in the same condition to the cooling members, thermoelectric cooling elements and temperature control members of the temperature control devices. As a result, a temperature difference between the temperature control devices may be reduced, and the temperature control devices can control the temperature of the treating solution with high accuracy.

In one example of the above substrate treating apparatus according to this invention, the temperature control devices are provided in a plurality of pairs for pinching the treating solution supply nozzle therebetween, the coolant being supplied in parallel to the cooling members of the temperature control devices. By supplying the coolant in this way, a thermal influence is given in the same condition to the cooling members, thermoelectric cooling elements and temperature control members of the temperature control devices. As a result, a temperature difference between the temperature control devices may be reduced, and the plural pairs of temperature control devices can control the temperature of the treating solution with high accuracy.

Another example of the above substrate treating apparatus according to this invention comprises a constant temperature adjusting device for setting the coolant to a predetermined temperature. This constant temperature adjusting device is effective to reduce temperature variations of the coolant. As a result, a temperature difference between the temperature control devices due to temperature variations of the coolant may be reduced, and the temperature control devices can control the temperature of the treating solution with high accuracy.

A further example of the above substrate treating apparatus according to this invention comprises a flow rate detecting device for detecting a flow rate of the coolant flowing through the coolant passage, and a flow adjusting device for adjusting the flow rate of the coolant. With the flow rate detecting device and flow adjusting device provided, based on a result of detecting the flow rate by the flow rate detecting device, the flow adjusting device can adjust the flow rate of the coolant to an extent not affecting the temperature difference between the temperature control devices. As a result, the temperature difference between the temperature control devices due to the flow rate of the coolant flowing through the coolant passage can be reduced, and the temperature control devices can control the temperature control of the treating solution with increased accuracy.

Apart from the apparatus according to the invention described above, the following findings (A) and (B) have been attained to solve problem (III) above.

What makes it difficult to control the temperature of the treating solution with high accuracy may stem not only from the circulation through the temperature control devices of the coolant, typically cooling water, but from a different factor. Thus, Inventors have checked on the different factor. This checking will be described by taking cooling water as an example of coolant.

(A) What is mainly used as cooling water is industrial cooling water. Industrial cooling water is subject to temperature variations of 10° C. or more day and night or from season to season. The temperature of the treating solution may be influenced not only by the thermoelectric cooling elements (Peltier elements) of the temperature control devices, but also by cooling water used to remove heat generating from the thermoelectric cooling elements. Thus, experiment has been conducted for confirmation purposes on the assumption that one of the causes of a temperature difference is the temperature variations of the industrial cooling water. FIGS. 28A and 28B show data obtained from the experiment.

In FIG. 28A, a target temperature of the treating solution is 20.0° C. In FIG. 28B, a target temperature of the treating solution is 26.0° C. Both figures show a relationship between actual temperature of the treating solution and temperature of cooling water based on results of the experiment. When the target temperature is 20.0° C., as shown in FIG. 28A, the temperature of cooling water from 15 to 20° C. results in an actual temperature of the treating solution at about 19.98° C. which is within the range of (20+0.1) to (20−0.1)° C. It has been confirmed that as the temperature of cooling water exceeds 20° C., the actual temperature of the treating solution increases also. Similarly, when the target temperature is 26.0° C., as shown in FIG. 28B, the actual temperature of the treating solution is within the range of (26+0.1) to (26−0.1)° C., and the actual temperature of the treating solution increases with the temperature of cooling water. These results of the experiment show that one of the causes of the temperature difference is temperature variations of the industrial cooling water. Then, what is necessary is to adjust the temperature of the coolant, typically cooling water.

(B) It has also been confirmed that a low flow rate of cooling water causes an outstanding temperature difference, and an increased flow rate decreases the temperature difference. Thus, it is desirable to detect a flow rate of the coolant, typically cooling water, and adjust the flow rate of the coolant according to results of the detection.

Based on the finding (A) above, this invention provides a substrate treating apparatus comprising the temperature control devices, block member, heat conductive member, supply port and discharge port noted hereinbefore, wherein each temperature control device includes:

a temperature control member disposed adjacent or in contact with the nozzle;

a thermoelectric cooling element for setting the temperature control member to a predetermined temperature by thermoelectric cooling effect; and a cooling member having a coolant passage for receiving a coolant for removing heat generating from the thermoelectric cooling element;

the apparatus further comprising a constant temperature adjusting device for setting the coolant to a predetermined temperature.

The substrate treating apparatus according to this invention has a constant temperature adjusting device, and this device sets the coolant to a predetermined temperature, thereby reducing temperature variations of the coolant. As a result, the temperature difference between the temperature control devices due to the temperature variations of the coolant may be reduced, and the temperature control devices can control the temperature of the treating solution with increased accuracy.

Based on the finding (B) above, this invention provides a substrate treating apparatus comprising the temperature control devices, block member, heat conductive member, supply port and discharge port noted hereinbefore, wherein each temperature control device includes:

a temperature control member arranged adjacent or in contact with the nozzle;

a thermoelectric cooling element for setting the temperature control member to a predetermined temperature by thermoelectric cooling effect; and a cooling member having a coolant passage for receiving a coolant for removing heat generating from the thermoelectric cooling element;

the apparatus further comprising:

a flow rate detecting device for detecting a flow rate of the coolant flowing through the coolant passage; and a flow adjusting device for adjusting the flow rate of the coolant.

The substrate treating apparatus according to this invention has a flow rate detecting device for detecting a flow rate of the coolant, and a flow adjusting device for adjusting the flow rate of the coolant. The flow rate detecting device detects a flow rate of the coolant flowing through the coolant passage, and the flow adjusting device adjusts the flow rate of the coolant. Based on a result of detecting the flow rate by the flow rate detecting device, the flow adjusting device can adjust the flow rate of the coolant to an extent not affecting the temperature difference between the temperature control devices. As a result, the temperature difference between the temperature control devices due to the flow rate of the coolant flowing through the coolant passage can be reduced, and the temperature control devices can control the temperature of the treating solution with increased accuracy. The flow rate effective for reducing the temperature difference is in a range of 0.1 to 2.0 lit. per minute, preferably in a range of 0.3 to 1.0 lit. per minute.

In a further aspect of the invention, there is provided a method of manufacturing a treating solution supply nozzle for supplying a treating solution to a substrate. This method comprises:

a channel forming step for forming a channel in a block member to open at least at one lateral surface of the block member;

an open surface closing step for face-bonding a heat conductive member to the lateral surface of the block member for closing the channel;

a supply port forming step for forming a supply port communicating with the channel for supplying the treating solution into the channel; and a discharge port forming step for forming a discharge port communicating with the channel for delivering the treating solution from the channel to the substrate.

According to the above method of manufacturing a treating solution supply nozzle, the channel forming step is executed to form a channel in the block member to open at least at one lateral surface of the block member. In the open surface closing step, a heat conductive member is face-bonded to the lateral surface of the block member, thereby closing the channel. In the supply port forming step, a supply port is formed to communicate with the channel for supplying the treating solution into the channel. In the discharge port forming step, a discharge port is formed to communicate with the channel for delivering the treating solution from the channel to the substrate.

With the manufacturing method having the above steps, the channel opening at least at one lateral surface of the block member is closed by the heat conductive member face-bonded to the lateral surface of the block member. The heat conductive member is face-bonded in direct contact to the open lateral surface of the block member. That is, no air is present between the block member and heat conductive member, thereby improving the efficiency of heat exchange. The treating solution supply nozzle formed through the above four steps only is simple in construction.

A method of manufacturing a treating solution supply nozzle according to this invention different from the above manufacturing method for supplying a treating solution to a substrate, comprises:

a channel forming step for forming a channel in a block member to extend between and open at front and back surfaces of the block member;

an open surface closing step for face-bonding heat conductive members to the front and back surfaces of the block member for closing the channel;

a supply port forming step for forming a supply port communicating with the channel for supplying the treating solution into the channel; and a discharge port forming step for forming a discharge port communicating with the channel for delivering the treating solution from the channel to the substrate.

According to the above method of manufacturing a treating solution supply nozzle, the channel forming step is executed to form a channel in the block member to extend between and open at front and back surfaces of the block member. In the open surface closing step, heat conductive members are face-bonded to the front and back surfaces of the block member, thereby closing the channel. In the supply port forming step, a supply port is formed to communicate with the channel for supplying the treating solution into the channel. In the discharge port forming step, a discharge port is formed to communicate with the channel for delivering the treating solution from the channel to the substrate.

With the manufacturing method having the above steps, the channel opening at the front and back surfaces of the block member is closed by the heat conductive members face-bonded to the front and back surfaces of the block member. The heat conductive members are face-bonded in direct contact to the open front and back surfaces of the block member. That is, no air is present between the block member and heat conductive members, thereby improving the efficiency of heat exchange. The treating solution supply nozzle formed through the above four steps only is simple in construction.

In the above methods of manufacturing a treating solution supply nozzle, the channel, preferably, is formed to direct the treating solution supplied from the supply port into the block member, to a lower position, then to an upper position higher than the lower position, and again downward to be delivered from the discharge port. This construction can supply the treating solution stably while reliably avoiding the possibility of air entering the channel.

Preferably, the manufacturing methods further comprise a resin bonding step for placing a chemical-resistant resin between the block member and the heat conductive member or members, and face-bonding at least the block member and the chemical-resistant resin. This resin placing and bonding step is effective for keeping the treating solution free from contamination and particles resulting from a direct contact between the treating solution and heat conductive member or members. Consequently, the clean treating solution may be supplied to the substrate.

Preferably, the face bonding is effected by heat fusion. With the face bonding effected by heat fusion, the components may be bonded together while preventing formation of air layers and minute clearances between the components. Consequently, the stable treating solution supply nozzle may be manufactured.

Preferably, the manufacturing methods further comprise a resin bonding step for placing a chemical-resistant resin between the block member and the heat conductive member or members, and face-bonding at least the block member and the chemical-resistant resin, the block member being formed of a resin identical to the resin bonded in the resin bonding step. The nozzle formed in this way has the block member and chemical-resistant resin heat-fused together easily and reliably in the resin bonding step. Consequently, the treating solution supply nozzle with increased stability may be manufactured.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 4 is a plan view showing an outline of a spin coating apparatus which is a substrate treating apparatus in a first embodiment of the invention;

FIG. 5 is a side view of the substrate treating apparatus shown in FIG. 4;

FIG. 21A is a sectional view showing another modified temperature control plates and receiving portions for solving problem (I);

FIG. 21B is a sectional view showing further modified temperature control plates and receiving portions for solving problem (I);

FIG. 21C is a sectional view showing further modified temperature control plates and receiving portions for solving problem (I);

FIG. 21D is a sectional view showing further modified temperature control plates and receiving portions for solving problem (I);

FIG. 23A is a sectional view showing further modified temperature control plates and positioning mechanism for solving problem (II);

FIG. 23B is a sectional view showing further modified temperature control plates and positioning mechanism for solving problem (II);

FIG. 23C is a sectional view showing further modified temperature control plates and positioning mechanism for solving problem (II);

FIG. 23D is a sectional view showing further modified temperature control plates and positioning mechanism for solving problem (II);

FIG. 23E is a sectional view showing further modified temperature control plates and positioning mechanism for solving problem (II);

FIG. 28A is a view showing a relationship between actual temperature of the treating solution and temperature of cooling water based on results of experiment, where a target temperature of the treating solution is 20.0° C.;

FIG. 28B is a view showing a relationship between actual temperature of the treating solution and temperature of cooling water based on results of experiment, where a target temperature of the treating solution is 26.0° C.;

DESCRIPTION OF THE PREFERRED EMBODIMENTS

Figure 1:
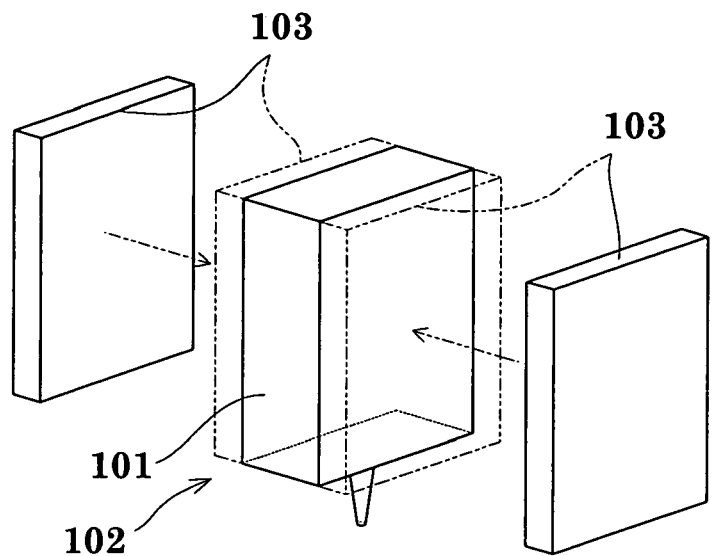
FIG. 1 is a schematic perspective view showing a conventional nozzle and temperature control plates.
Figure 2:
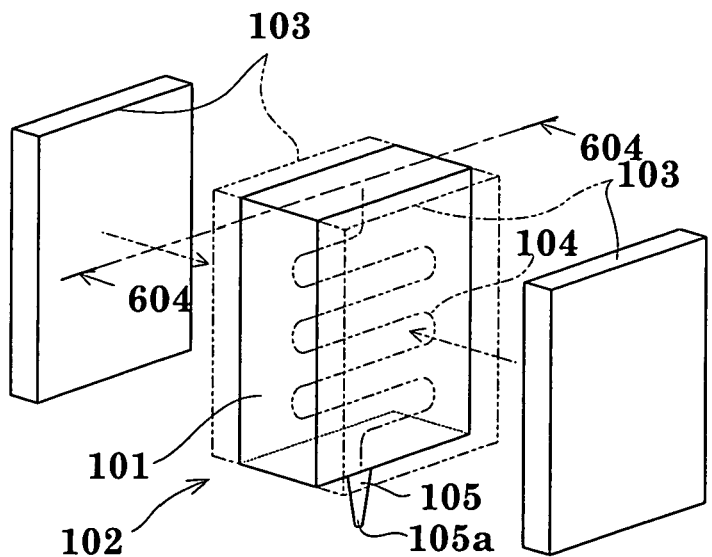
FIG. 2 is a schematic perspective view showing the conventional nozzle having a meandering pipe and the temperature control plates.
Figure 3A:
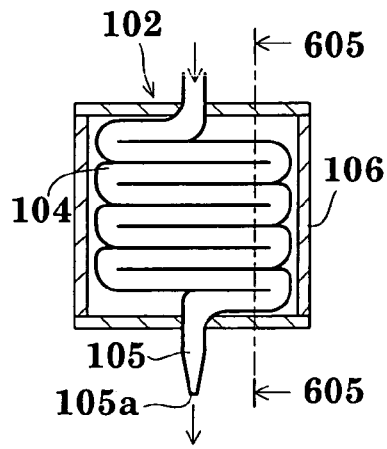
FIG. 3A is a section of the nozzle taken on line 604-604 of FIG. 2.
Figure 3B:
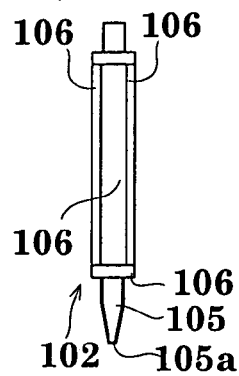
FIG. 3B is a side view of the nozzle shown in FIG. 2.
Figure 3C:
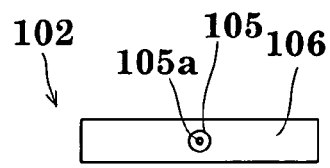
FIG. 3C is a bottom view of the nozzle shown in FIG. 2.
Figure 3D:
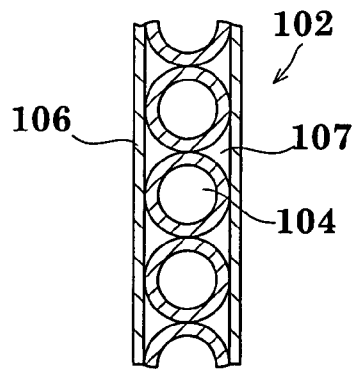
FIG. 3D is a section of the nozzle taken on line 605-605 of FIG. 3A.

Preferred embodiments of this invention will be described in detail hereinafter with reference to the drawings.

First Embodiment

FIG. 4 is a plan view showing an outline of a spin coating apparatus which is a substrate treating apparatus in a first embodiment of the invention. FIG. 5 is a side view of the apparatus.

In the first embodiment, a spin coating apparatus will be described as an example of substrate treating apparatus. The spin coating apparatus performs resist treatment of semiconductor wafers (hereinafter called simply "wafers") by delivering a resist solution as a treating solution to the wafers.

As shown in FIG. 4, the spin coating apparatus includes a spin treating station 10 for spin-coating a wafer W with the treating solution supplied thereto, a nozzle gripper 30 for gripping a nozzle 20 that delivers the treating solution, a vertical moving device 40 (FIG. 5) for moving the nozzle gripper 30 vertically (in directions of Z-axis), a Y-axis horizontal moving device 50 for moving the nozzle gripper 30 in directions of Y-axis, an X-axis horizontal moving device 60 for moving the nozzle gripper 30 in directions of X-axis, and a standby station 70 for storing a plurality of (e.g. six in the first embodiment) nozzles 20.

The spin treating station 10 includes a turntable 11 for supporting and spinning the wafer W in horizontal posture, and a hollow scatter preventive cup 12 surrounding the turntable 11 for preventing the treating solution dispelled from the wafer W from scattering to the ambient. The scatter preventive cup 12 is vertically movable by a lift mechanism not shown. In time of spinning the wafer W, the scatter preventive cup 12 is raised to prevent the treating solution delivered to the wafer W from scattering outwardly of the cup 12. The treating solution scattering inside and received by the scatter preventive cup 12 is collected by a drain collecting structure, not shown, provided for the scatter preventive cup 12.

As shown in FIGS. 4 and 5, the plurality of (e.g. six) nozzles 20 for delivering different types of treating solution to the wafer W are stored in the standby station 70. In use, a selected one of the nozzles 20 is moved from the standby station 70 to a predetermined position over the wafer W in the spin treating station 10, and the treating solution is delivered from a discharge opening at the tip of nozzle 20 to the wafer W.

Figure 6A:
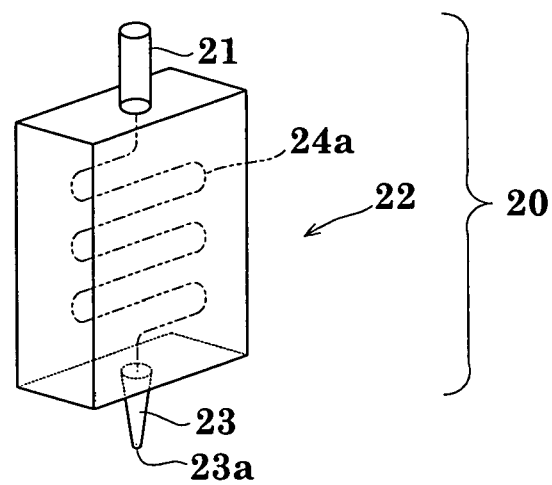
FIG. 6A is a schematic perspective view showing an outward appearance of a nozzle.
Figure 6B:
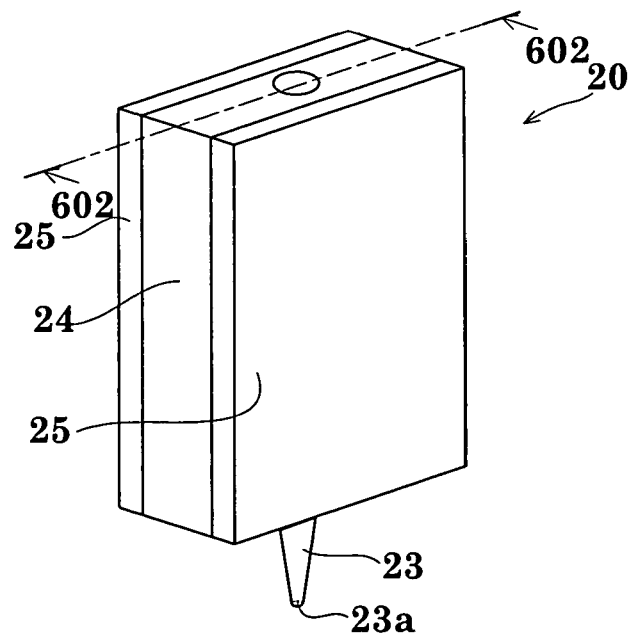
FIG. 6B is a schematic perspective view showing a temperature control surface of the nozzle.
Figure 7:
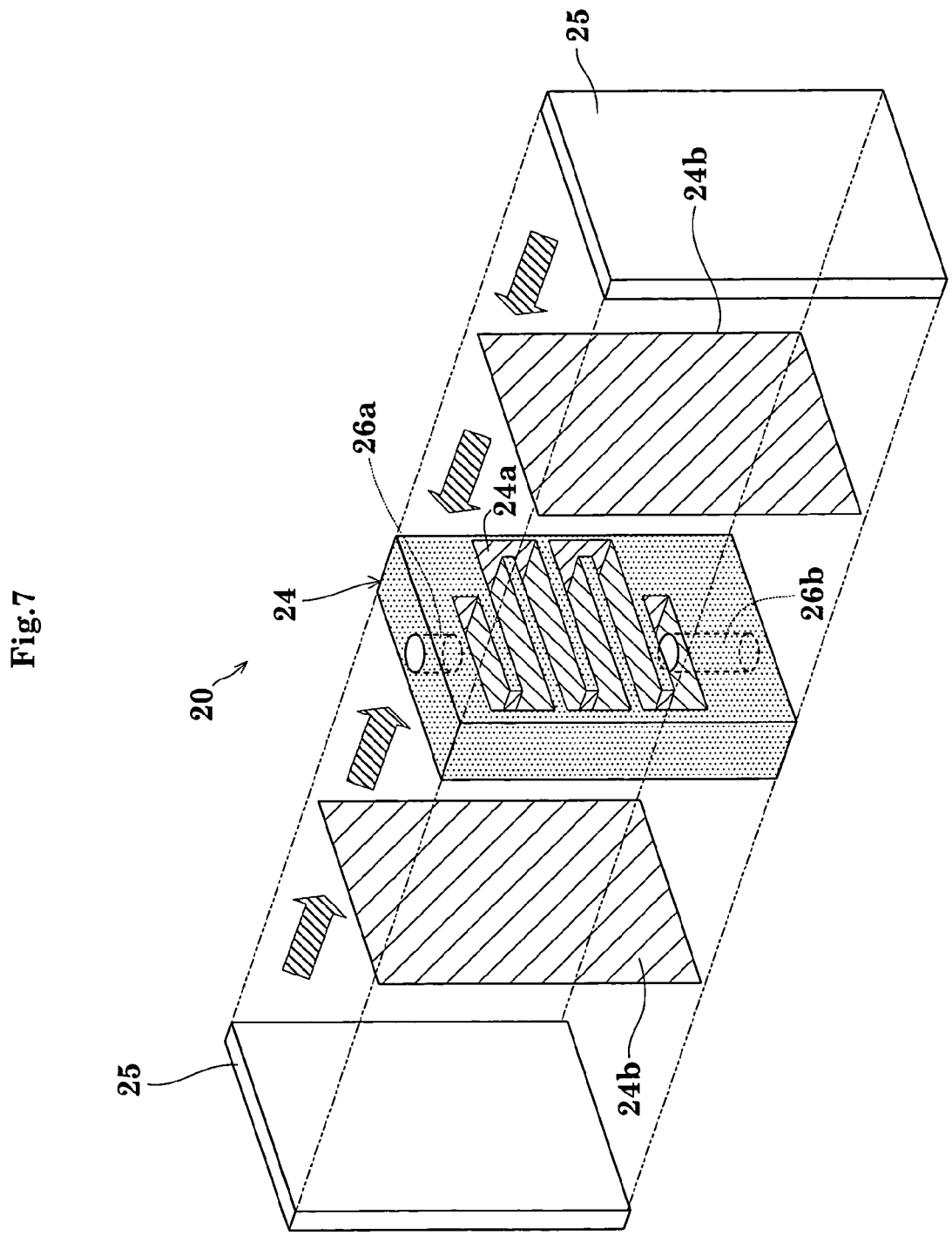
FIG. 7 is an exploded perspective view of a resin block and heat conductive members constituting the nozzle.
Figure 8A:
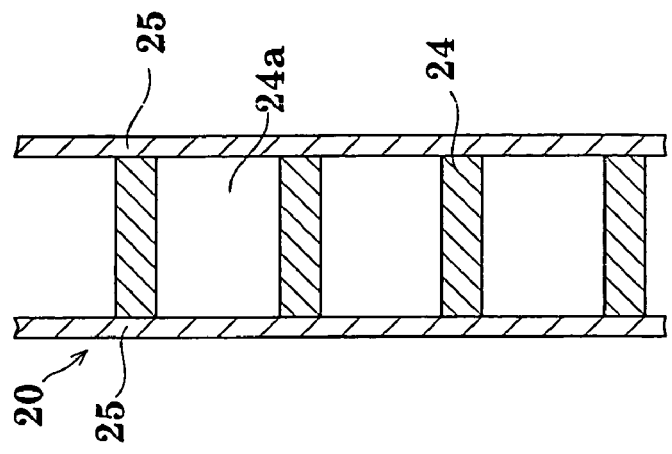
FIG. 8A is a section of the nozzle taken on line 602-602 of FIG. 6B.
Figure 8B:
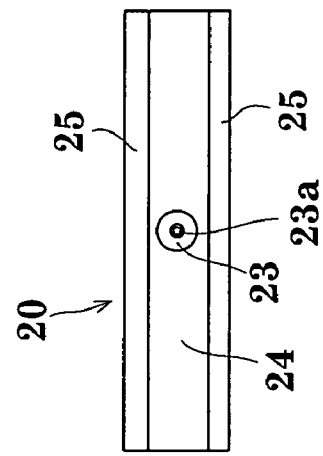
FIG. 8B is a side view of the nozzle.
Figure 8C:
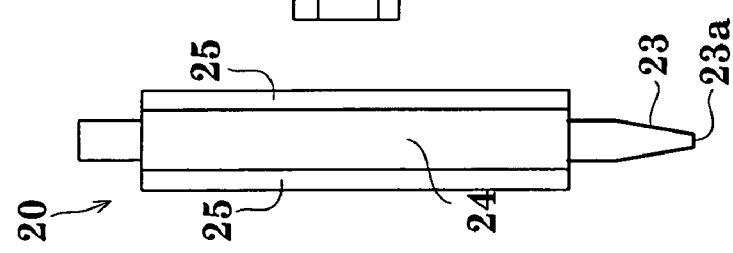
FIG. 8C is a bottom view of the nozzle.
Figure 8D:
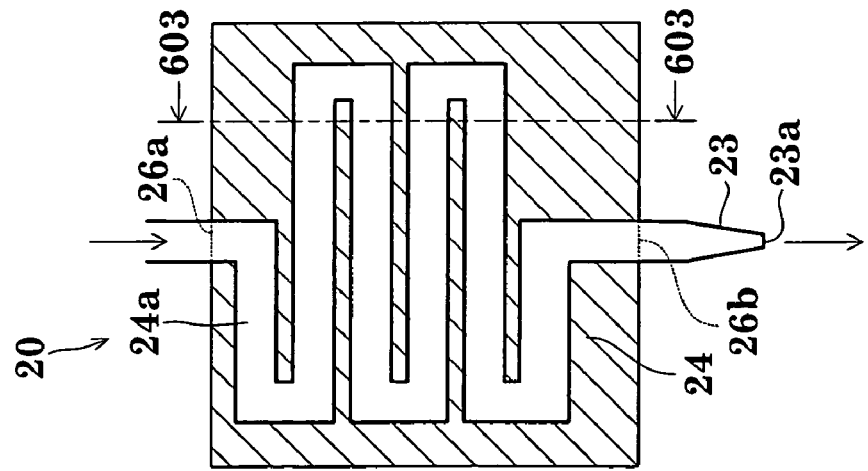
FIG. 8D is a section of the nozzle taken on line 603-603 of FIG. 8A.

This nozzle 20 will be described in detail with reference to FIGS. 6A, 6B, 7 and 8A through 8D. FIG. 6A is a schematic perspective view showing an outward appearance of the nozzle 20. FIG. 6B is a schematic perspective view showing a temperature control surface of the nozzle 20. FIG. 7 is an exploded perspective view of a resin block and heat conductive members constituting the nozzle 20. FIG. 8A is a section of the nozzle 20 taken on line 602-602 of FIG. 6B. FIG. 8B is a side view of the nozzle 20. FIG. 8C is a bottom view of the nozzle 20. FIG. 8D is a section of the nozzle 20 taken on line 603-603 of FIG. 8A.

As shown in FIGS. 6B and 7, the nozzle 20 includes a resin block 24, and two heat conductive members 25 sandwiching the resin block 24 therebetween. The resin block 24 is formed of tetrafluoroethylene-perfluoroalkoxy-ethylene copolymer resin (hereinafter simply called "PFA resin") among fluorine resins. The PFA resin forming the resin block 24 is highly resistant to chemicals (chemical-resistant resin). The heat conductive members 25 may be formed of aluminum, copper, stainless steel or carbon, for example.

As shown in FIG. 7, the resin block 24 has a meandering treating solution channel 24a inside. The treating solution channel 24a extends between and opens at front and back surfaces of the resin block 24. Between each heat conductive member 25 and the resin block 24 is a film-like member 24b formed of the same PFA resin as the resin block 24. The treating solution channel 24a is formed as a meandering channel to have a large surface area per volume.

The above nozzle 20 corresponds to the treating solution supply nozzle in this invention. The resin block 24 corresponds to the block member in this invention. The treating solution channel 24a corresponds to the channel in this invention.

The film-like members 24b may be formed of a different material to the resin (PFA resin) forming the resin block 24. For example, the film-like members 24b may be formed of a fluorine resin other than the PFA resin (such as polypropylene resin [PP] or tetrafluoroethylene resin [PTFE]). The film-like members 24b in the first embodiment correspond to the chemical-resistant resins disposed between the block member and heat conductive members in this invention.

The two heat conductive members 25 are attached in face to face contact to the front and back surfaces of the resin block 24, thereby closing the opening sides of the treating solution channel 24a. As a result, a treating solution reservoir 22 is formed as shown in FIGS. 6A, 6B and 8A through 8D.

The treating solution reservoir 22 stores a predetermined quantity (at least a quantity to be used in a next delivery cycle) of the treating solution supplied through a treating solution pipe 21 connected to the nozzle 20. That is, the treating solution for one shot (e.g. 1 to 10 cm$^3$) to be delivered to the wafer W next is stored in the reservoir 22, and the treating solution is delivered from the reservoir 22 to the wafer W through a discharge opening 23a at the tip of a projection 23.

The treating solution reservoir 22 has a supply port 26a formed in an upper position thereof and communicating with the treating solution channel 24a for supplying the treating solution into the treating solution channel 24a through the treating solution pipe 21 (see FIGS. 6A, 6B and 8A through 8D). Further, the treating solution reservoir 22 has a discharge port 26b formed in a lower position thereof and communicating with the treating solution channel 24a for supplying the treating solution flowing in the treating solution channel 24a to the wafer W through the projection 23 formed at the lower end of the nozzle 20 (see FIGS. 6A, 6B and 8A through 8D).

A method of manufacturing the nozzle 20 will be described now. First, part of the resin block 24 formed of the PFA resin is perforated through the front and back surfaces to form the treating solution channel 24a in the resin block 24 to extend between and open at the front and back surfaces of the resin block 24. The formation of the treating solution channel 24a corresponds to the channel forming step in this invention.

The heat conductive members 25 are bonded in face to face contact to the front and back surfaces of the resin block 24 where the treating solution channel 24a are open, thereby closing the open sides of the treating solution channel 24a. The closing of the open sides forms the treating solution reservoir 22. In this closing operation, the face bonding is effected by heat-fusing the resin block 24 and heat conductive members 25, with the film-like members 24b formed of the fluorine resin (PFA resin) being interposed in between. The film-like members 24b are 0.05 to 0.5 mm thick. The closing of the open sides of treating solution channel 24a corresponds to the open side closing step in this invention. The face bonding of the resin block 24 and heat conductive members 25 with the film-like members 24b interposed in between corresponds to the resin bonding step in this invention.

The supply port 26a and discharge port 26b are formed after the face bonding. However, the supply port 26a and discharge port 26b may be formed before the face bonding. The formation of these ports is not limited to a particular time. The formation of the supply port 26a corresponds to the supply port forming step in this invention. The formation of the discharge port 26b corresponds to the discharge port forming step in this invention. The nozzle 20 is formed as described above.

Figure 9:
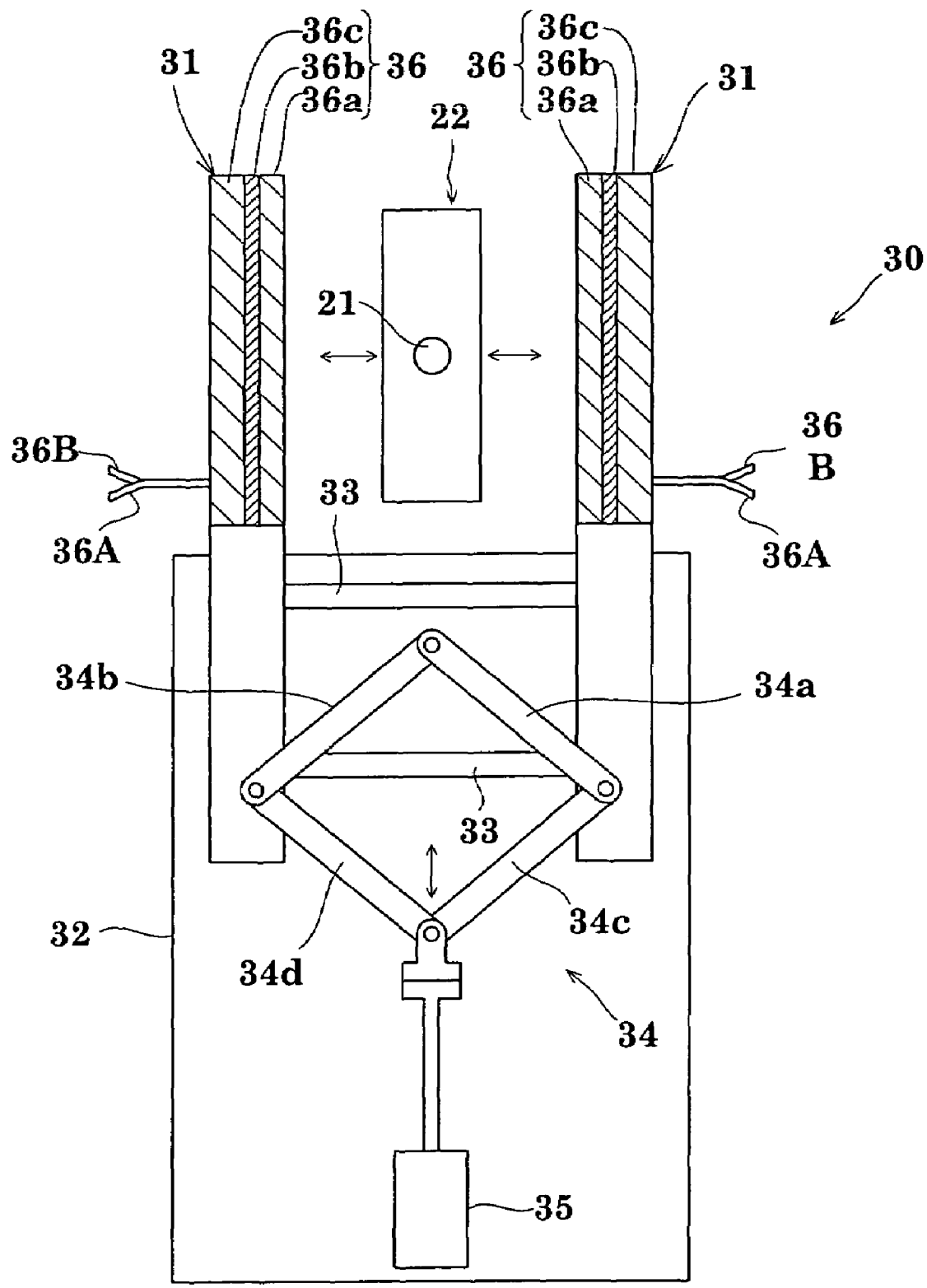
FIG. 9 is a plan view showing an outline of a nozzle gripper.

The nozzle gripper 30 will be described in detail with reference to FIG. 9. FIG. 9 is a plan view showing an outline of the nozzle gripper 30. The nozzle gripper 30 includes a pair of gripping arms 31 for gripping the treating solution reservoir 22 of nozzle 20. The gripping arms 31 are mounted to be movable toward and away from each other in the directions of Y-axis along rails 33 laid on the upper surface of a base 32.

Adjacent the proximal ends of the pair of gripping arms 31 are a link mechanism 34 for horizontally moving the gripping arms 31 toward and away from each other, and a drive cylinder 35 for actuating the link mechanism 34. The link mechanism 34 has a four-point link structure, with an end of a link 34a and an end of a link 34b pivotally connected, and a connection between a link 34c and a link 34d is connected to a rod of the drive cylinder 35. Further, a connection between the link 34b and link 34d and a connection between the link 34a and link 34c are attached to the gripping arms 31, respectively. When the rod of drive cylinder 35 is extended, the gripping arms 31 move away from each other to release the nozzle 20. When the rod of drive cylinder 35 is retracted, the gripping arms 31 approach each other to grip the treating solution reservoir 22 of nozzle 20.

The gripping arms 31 include temperature control plates 36, respectively, for holding the treating solution reservoir 22 therebetween and controlling the temperature of the treating solution in the treating solution reservoir 22 through heat exchange. The temperature control plates 36 have a size corresponding to the heat exchange portions (heat conductive members 25) of the treating solution reservoir 22. The temperature control plates 36 may be larger than the heat exchange portions of the treating solution reservoir 22. The temperature control plates 36 may be smaller than the heat exchange portions as long as this presents no problem in the temperature control of the treating solution reservoir 22. The temperature control plates 36 correspond to the temperature control devices in this invention.

The pair of temperature control plates 36 have pinching plates 36a attached to opposed surfaces thereof for contacting the treating solution reservoir 22. The pinching plates 36a have Peltier elements 36b attached to non-pinching surfaces thereof to act as thermoelectric cooling elements. The Peltier elements 36b can, by thermoelectric cooling effect, set the pinching plates 36a to a predetermined temperature in a short time. The Peltier elements 36b have cooling water circulating members 36c arranged on surfaces thereof facing away from the pinching plates 36a for supplying cooling water to remove heat generating from the Peltier elements 36b. Each cooling water circulating member 36c has, connected to one end thereof, a cooling water supply pipe 36A for supplying cooling water into the circulating member 36c, and a cooling water drain pipe 36B for draining the cooling water. The cooling water supply pipe 36A and cooling water drain pipe 36B are connected to a cooling water feeder (not shown) disposed outside.

Figure 10:
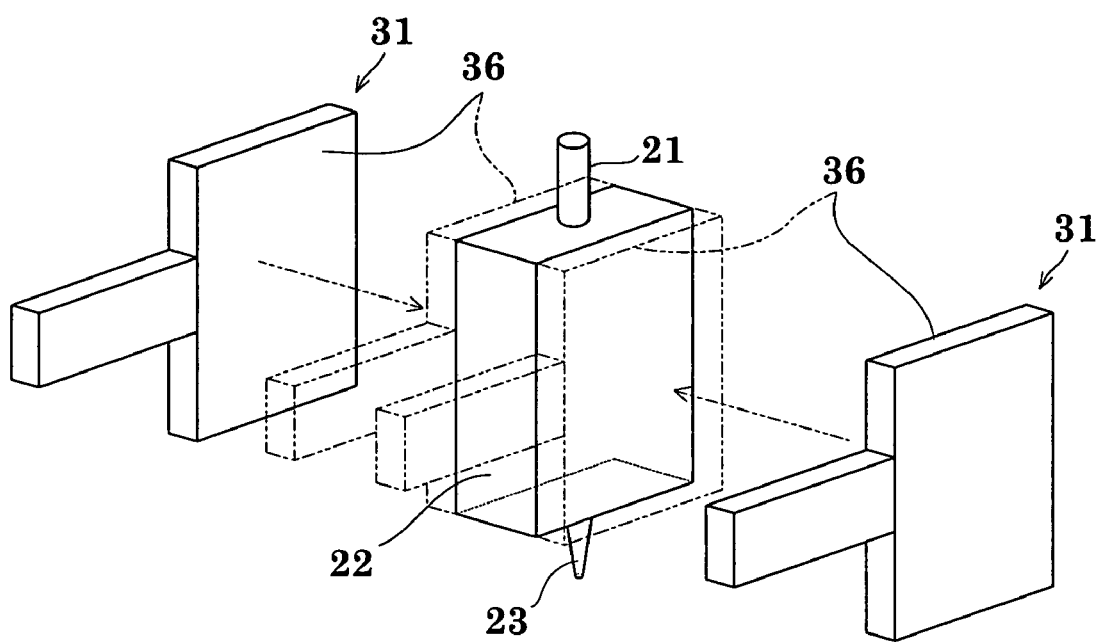
FIG. 10 is an explanatory view showing a gripping operation of the nozzle gripper shown in FIG. 9.

When the pair of temperature control plates 36 hold the nozzle 20 therebetween, as shown in FIG. 10, the pair of gripping arms 31 of the nozzle gripper 30 grip the heat exchange portions (heat conductive members 25) of the treating solution reservoir 22 of the nozzle 20 and control the temperature of the treating solution in the treating solution reservoir 22 through heat exchange.

As shown in FIG. 5, the spin coating apparatus has, disposed in predetermined positions thereof, a control unit 88 for driving the Peltier elements 36b, and a power source 89 for supplying a source voltage to the control unit 88. The temperature of the treating solution in the treating solution reservoir 22 (FIG. 9) is transmitted from a temperature sensor (e.g. thermocouple) to the control unit 88. The control unit 88 controls a supply of source voltage to the Peltier elements 36b of the temperature control plates 36 to set the treating solution to a predetermined temperature.

In time of temperature control, the pair of temperature control plates 36 pinch the treating solution reservoir 22 of nozzle 20 therebetween with a predetermined pressing force. That is, the temperature control plates 36 are placed in contact with the heat conductive members 25 (FIGS. 7 and 8B through 8D) of the treating solution reservoir 22 under increased contact pressure. The temperature of the treating solution in the treating solution reservoir 22 is controlled through heat exchange.

Next, the vertical moving device 40, Y-axis horizontal moving device 50 and X-axis horizontal moving device 60 will be described with reference to FIGS. 4 and 5. As shown in FIGS. 4 and 5, the nozzle gripper 30 is attached to the vertical moving device 40 for moving the nozzle gripper 30 vertically (i.e. in the directions of Z-axis). The vertical moving device 40 includes a support member 41 for supporting the nozzle gripper 30, and a lifting mechanism 42 for vertically moving the support member 41.

The lifting mechanism 42 is connected to a horizontally movable member 51 of Y-axis horizontal moving device 50 for horizontally moving the nozzle gripper 30 in the directions of Y-axis. The horizontally movable member 51 has an end thereof engaged with a rotary screw 52 extending along Y-axis. The rotary screw 52 is rotatable by a drive motor not shown. Thus, the horizontally movable member 51 engaged with the rotary screw 52 reciprocates in the directions of Y-axis, whereby the vertical moving device 40 and nozzle gripper 30 also reciprocate in the directions of Y-axis.

Further, the Y-axis horizontal moving device 50 includes a slide plate 61 having one end thereof engaged with a rotary screw 62 of X-axis horizontal moving device 60 extending along X-axis. The rotary screw 62 is rotatable by a drive motor not shown. With rotation of the rotary screw 62, the slide plate 61 reciprocates along a guide 63 in the directions of X-axis, whereby the Y-axis horizontal moving device 50, vertical moving device 40 and nozzle gripper 30 also reciprocate in the directions of X-axis.

As shown in FIG. 4, the standby station 70 includes, for example, six storage pots 71, described hereinafter, arranged along Y-axis. These storage pots 71, respectively, store the six nozzles 20 connected through treating solution pipes 21 to treating solution sources (not shown) for supplying the different types of treating solution. Each treating solution pipe 21 has an electromagnetic valve and a pump (not shown) connected thereto adjacent the treating solution source (not shown). Thus, a predetermined quantity of treating solution is supplied to the nozzle 20 through the treating solution pipe 21.

Figure 11:
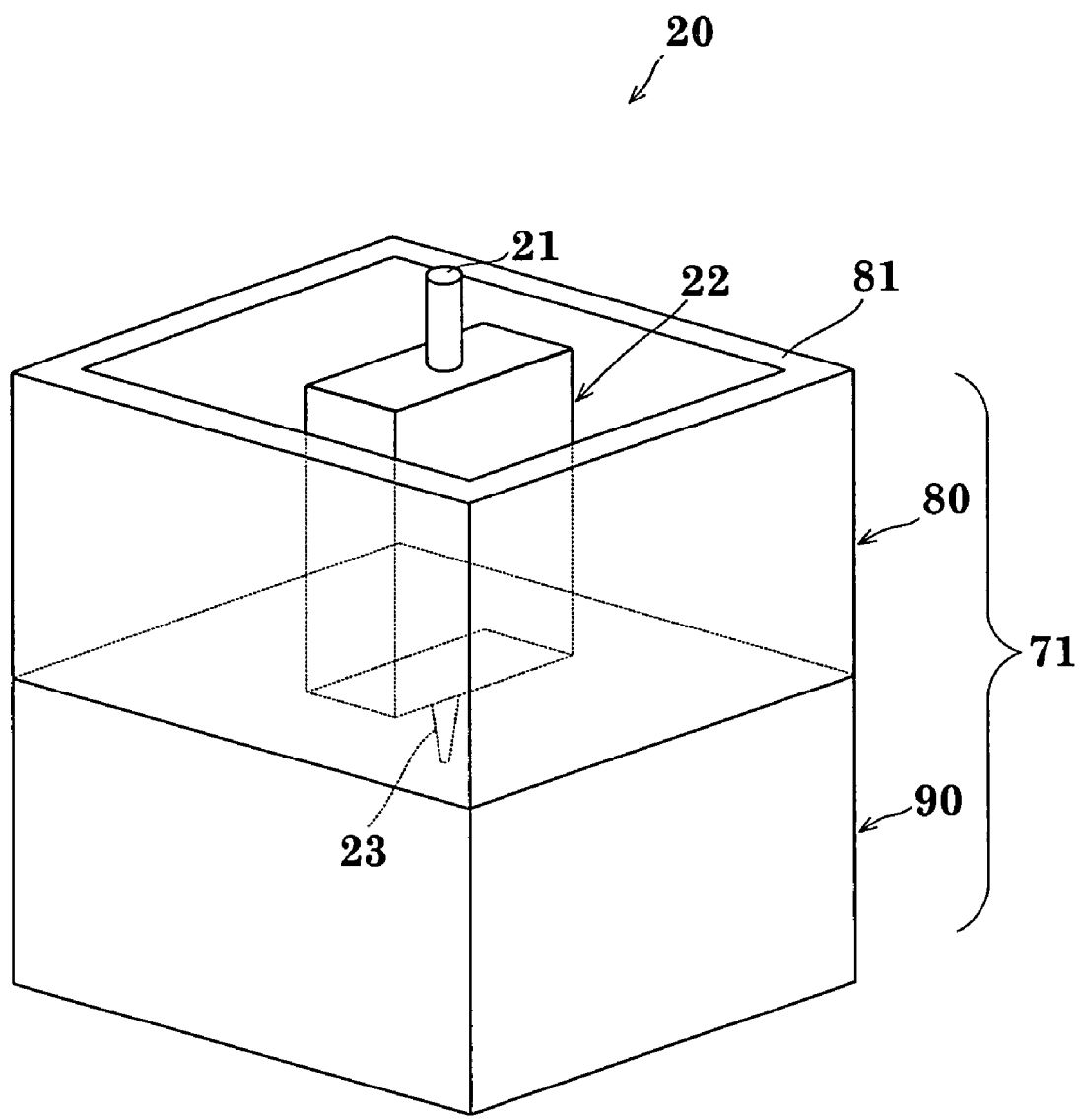
FIG. 11 is a schematic perspective view showing an outline of a storage pot.
Figure 12A:
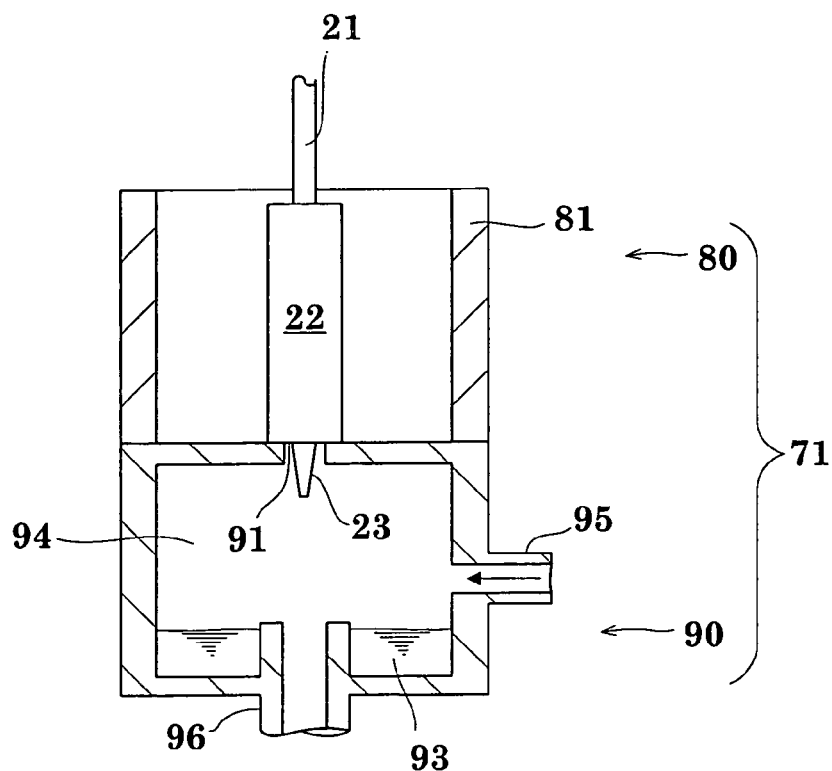
FIG. 12A is a section of the storage pot taken on line 601-601 of FIG. 4.
Figure 12B:
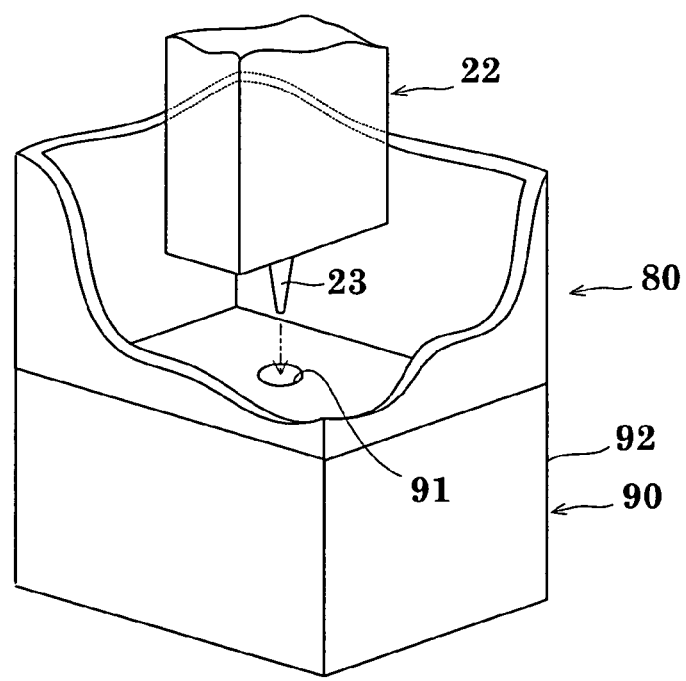
FIG. 12B is an explanatory view illustrating a projection of the nozzle lying in a standby pot when the nozzle is in the storage pot.

Next, the storage pots 71 will be described in detail with reference to FIGS. 11, 12A and 12B. FIG. 11 is a schematic perspective view showing an outline of a storage pot 71. FIG. 12A is a section of the storage pot 71 taken on line 601-601 of FIG. 4. FIG. 12B is an explanatory view illustrating the projection 23 of the nozzle 20 lying in a standby pot 90 when the nozzle 20 is in the storage pot 71.

As shown in FIGS. 11 and 12A, each storage pot 71 includes an erecting pot 80 for receiving the nozzle 20 in erect posture, and a standby pot 90 for maintaining the projection 23 of nozzle 20 in a solvent atmosphere. The storage pot 71 has a two-stage construction with the erecting pot 80 stacked on the standby pot 90.

The erecting pot 80 will be described first. As shown in FIG. 11, the erecting pot 80 includes an erecting container body 81 for receiving the nozzle 20. The container body 81 is open at the top and bottom thereof. The nozzle 20 is moved into the container body 81 through the top opening.

The standby pot 90 disposed under the erecting pot 80 will be described next. The standby pot 90 includes a standby container body 92 having a bore 91 formed in the upper surface thereof for receiving the projection 25 of nozzle 20. The projection 25 of nozzle 20 on standby is placed in a solvent atmosphere. The standby container body 92 defines a solvent sump 93 in a lower position thereof for storing a solvent, and a solvent space 94 above the solvent sump 93. A solvent supply pipe 95 is connected to the solvent space 94 for supplying the solvent. A drain pipe 96 is connected to a position of the standby container body 92 under the projection 25 of nozzle 20 for draining the treating solution dripping from the nozzle 20.

The receiving bore 91 of the standby pot 90 may be closed as appropriate in order to stop the solvent atmosphere flowing through the bore 91 into the erecting pot 80 when the nozzle 20 is withdrawn from the storage pot 71. Thus, the projection 23 of nozzle 20 extends through the bore 91 of the standby pot 90 under the erecting pot 80, to be maintained in the solvent atmosphere.

Operation of the spin coating apparatus in the first embodiment will be described next. As shown in FIG. 4, the standby station 70 stores the plurality of (six in the first embodiment) nozzles 20 connected to the treating solution sources (not shown) which supply different types of treating solution through the treating solution pipes 21. These nozzles 20 are on standby and placed in the storage pots 71.

As shown in FIG. 11, each nozzle 20 placed in the storage pot 71 has the treating solution supplied thereto through the treating solution pipe 21 from the treating solution source (not shown). The treating solution is stored in a predetermined quantity in the treating solution reservoir 22.

The spin coating apparatus selects a treating solution to be supplied to the wafer W according to predetermined treating conditions, and selects a corresponding nozzle 20. Once a nozzle 20 is selected, the vertical moving device 40, Y-axis horizontal moving device 50 and X-axis horizontal moving device 60 are driven to move the nozzle gripper 30, with the pair of gripping arms 31 opened, toward the selected nozzle 20. As the pair of gripping arms 31 are opened, the pair of temperature control plates 36 also are opened to approach the nozzle 20.

The temperature control plates 36 of the pair of gripping arms 31 grip the nozzle 20 and effect temperature control. Then, the vertical moving device 40 is driven to raise the nozzle 20 gripped, and Y-axis horizontal moving device 50 and X-axis horizontal moving device 60 are driven to move the nozzle 20 to the predetermined position over the wafer W, e.g. a position over the center of wafer W, in the spin treating station 10.

The control unit 88 measures the temperature of the treating solution in the treating solution reservoir 22 by means of the temperature sensor (not shown) in the form of a thermocouple, for example, provided for the temperature control plates 36. Based on the result of this measurement, the control unit 88 drives the Peltier elements 36b of the temperature control plates 36 to adjust the treating solution in the treating solution reservoir 22 to the predetermined temperature. The time of the temperature control is not limited to the time of the above movement but may be during the standby of the nozzle 20 in the gripped state.

The nozzle 20 in the predetermined position over the wafer W delivers the treating solution in the treating solution reservoir 22 adjusted to the predetermined temperature to the surface of wafer W. Then, the wafer W is spun to spread the treating solution over the surface of wafer W. The temperature of the treating solution adjusted to a predetermined value effectively inhibits variations in thickness of a film due to an improper temperature of the treating solution.

According to the spin coating apparatus in the first embodiment, as described above, the nozzle 20 has the resin block 24, heat conductive members 25, supply port 26a and discharge port 26b. In the method of manufacturing the nozzle 20, the treating solution channel 24a is formed in the resin block 24 to extend between and open at the front and back surfaces of the resin block 24. The heat conductive members 25 are bonded in face to face contact to the front and back surfaces of the resin block 24 where the treating solution channel 24a are open, thereby closing the open sides of the treating solution channel 24a. The supply port 26a is formed in communication with the treating solution channel 24a for supplying the treating solution into the treating solution channel 24a. The discharge port 26b is formed in communication with the treating solution channel 24a for supplying the treating solution flowing in the treating solution channel 24a to the wafer W.

According to this manufacturing method, as shown in FIG. 8D, the treating solution channel 24a extending between and opening at the front and back surfaces of the resin block 24 is closed by the heat conductive members 25 bonded in face to face contact to the front and back surfaces. Thus, the heat conductive members 25 face-bonded to the front and back surfaces are in direct contact with the resin block 24. That is, no air is present between the resin block 24 and heat conductive members 25, thereby improving the efficiency of heat exchange. This manufacturing method realizes the nozzle 20 having a simple construction since the nozzle 20 is formed only by face-bonding the heat conductive members 25 to the open front and back surfaces of the resin block 24.

In the first embodiment, the film-like members 24b are interposed between the resin block 24 and heat conductive members 25. The film-like members 24b are formed of PFA resin which is a chemical-resistant resin. This is effective for keeping the treating solution free from contamination (e.g. metallic contamination) and particles (e.g. metal powder) resulting from a direct contact between the treating solution and heat conductive members 25. Consequently, the clean treating solution may be supplied to the wafer W.

In the first embodiment, the face bonding is effected by heat fusion, thereby bonding the components together while preventing formation of air layers and minute clearances between the components. Consequently, the stable nozzle 20 may be manufactured.

In the first embodiment, the resin block 24 and interposed film-like members 24b are formed of the same PFA resin. Thus, the resin block 24 and film-like members 24b may be heat-fused together easily and reliably. Consequently, the nozzle 20 with increased stability may be manufactured.

According to the spin coating apparatus in the first embodiment, the pair of temperature control plates 36 hold and control the temperature of the resin block 24 along with the heat conductive members 25 face-bonded to the open sides of the treating solution channel 24a in the resin block 24. Thus, the temperature of the treating solution in the treating solution channel 24a may be controlled through the heat conductive members 25 effectively. The treating solution adjusted to a desired temperature is supplied through the discharge port 26b and from the discharge opening 23a of the nozzle 20 to the wafer W to treat the wafer W with high accuracy.

Second Embodiment

Figure 13:
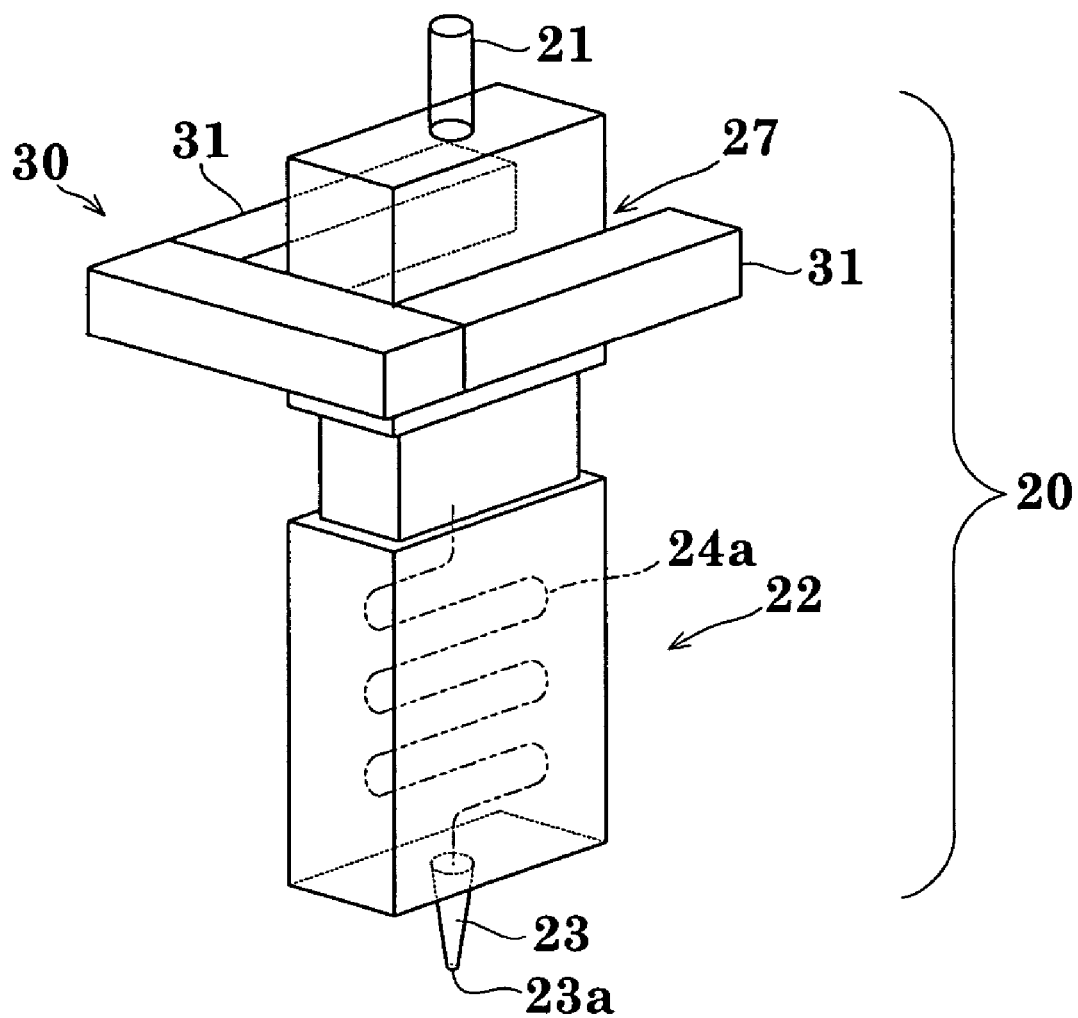
FIG. 13 is a schematic perspective view showing an outward appearance of a nozzle of a substrate treating apparatus in a second embodiment of the invention.
Figure 14:
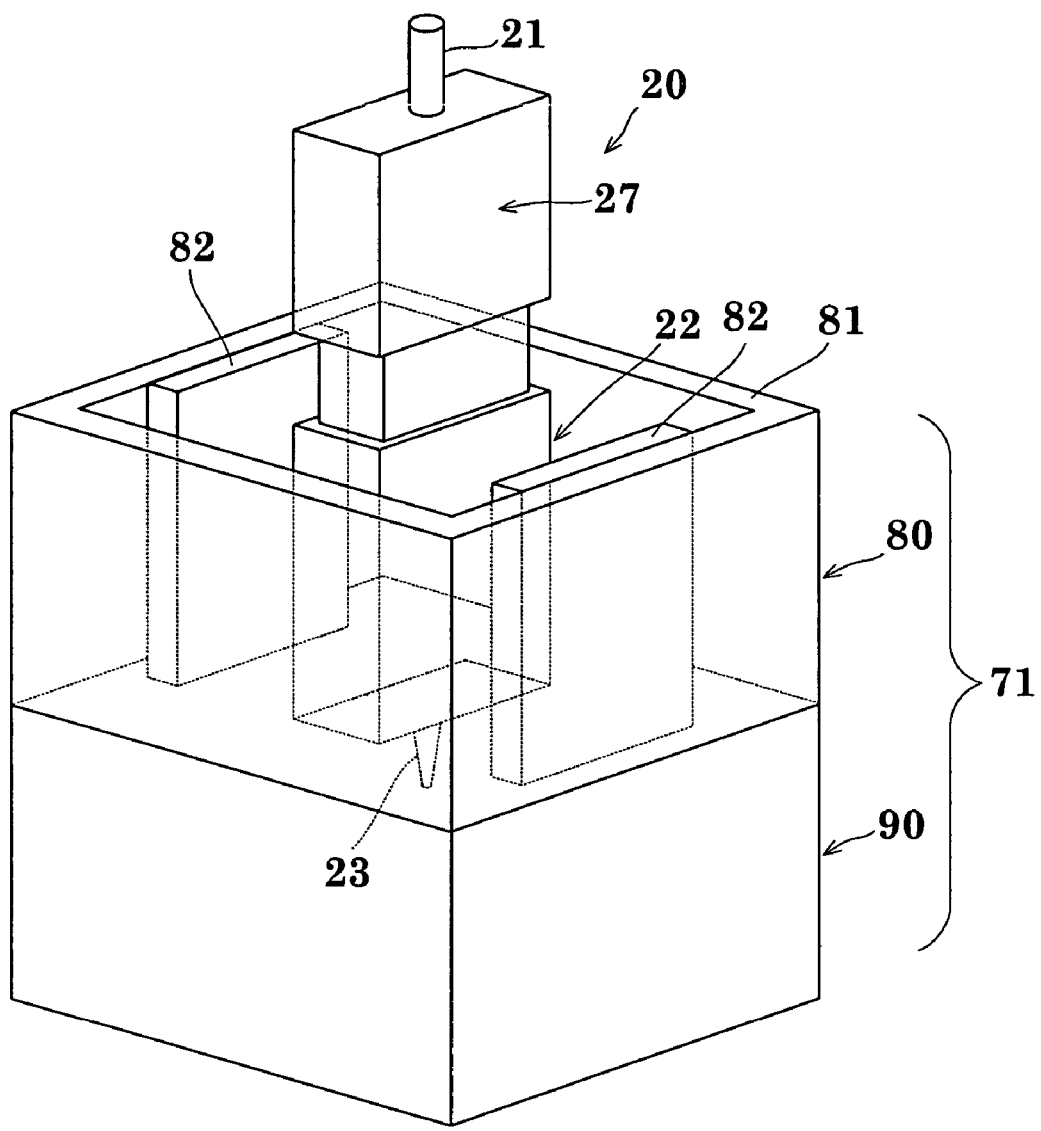
FIG. 14 is a schematic perspective view showing an outline of a storage pot in the second embodiment.

A second embodiment will be described with reference to FIGS. 13 and 14. FIG. 13 is a schematic perspective view showing an outward appearance of a nozzle of a substrate treating apparatus in the second embodiment of the invention. FIG. 14 is a schematic perspective view showing an outline of a storage pot in the second embodiment.

In the first embodiment described above, the pair of gripping arms 31 of the nozzle gripper 30, respectively, have the temperature control plates 36 shown in FIG. 10. The nozzle gripper 30 effects temperature control, while in movement or on standby, of the nozzle 20 held between the gripping arms 31. In the second embodiment, a pair of temperature control plates 82 having the same construction as in the first embodiment are arranged in the erecting pot 80 shown in FIGS. 11, 12A, and 12B. The nozzle 20 receives a temperature control while in the storage pot 71. In the second embodiment and a third embodiment described hereinafter, the erecting pot 80 will be described as "temperature control pot 80". Like reference numerals are used to identify like parts in the first embodiment and will not particularly be described again.

In the second embodiment, the nozzle 20 receives a temperature control while in the storage pot 71, and there is no need to give the temperature control to the nozzle 20 while the temperature control plates 36 of the pair of gripping arms 31 hold the treating solution reservoir 22 therebetween. Thus, the pair of gripping arms 31, instead of gripping the treating solution reservoir 22 of the nozzle 20 as in the first embodiment, as shown in FIG. 13, grip a grip portion 27 disposed adjacent the proximal end of the nozzle, i.e. in a position above the treating solution reservoir 22. The grip portion 27 of nozzle 20 is formed of a heat insulating material. The nozzle 20 is moved with the nozzle gripper 30 gripping the grip portion 27 of nozzle 20.

The temperature control pot 80 in the second embodiment is different from the erecting pot 80 in the first embodiment in having a temperature control function. Thus, as shown in FIG. 14, the storage pot 71 includes the temperature control pot 80 for controlling the temperature of the treating solution reservoir 22 of the nozzle 20, and the same standby pot 90 as in the first embodiment.

The temperature control pot 80 includes a temperature control container body 81 for receiving the nozzle 20, and a pair of temperature control plates 82 arranged in the container body 81 for holding the treating solution reservoir 22 of nozzle 20 therebetween. The container body 81 is open at the top and bottom thereof. The nozzle 20 is moved into the container body 81 through the top opening. The pair of temperature control plates 82 are movable toward each other to hold the treating solution reservoir 22 therebetween in time of temperature control, and away from each other to release the reservoir 22 when the nozzle 20 is moved into or out of the container body 81. The temperature control plates 82 have the same construction as the temperature control plates 36 in the first embodiment.

As noted above, the nozzle 20 receives a temperature control while in the storage pot 71, and there is no need to give the temperature control to the nozzle 20 held by the pair of gripping arms 31. However, the pair of gripping arms 31 may include temperature control plates 36, respectively, as in the first embodiment, for holding the treating solution reservoir 22 and controlling the temperature of the treating solution.

According to the spin coating apparatus in the second embodiment, as in the first embodiment, the pair of temperature control plates 82 hold and control the temperature of the resin block 24 and the heat conductive members 25 (FIGS. 7 and 8B through 8D). Thus, the temperature of the treating solution in the treating solution channel 24a may be controlled through the heat conductive members 25 effectively. The treating solution adjusted to a desired temperature is supplied through the discharge port 26b and from the discharge opening 23a of the nozzle 20 to the wafer W to treat the wafer W with high accuracy.

Third Embodiment

Figure 15:
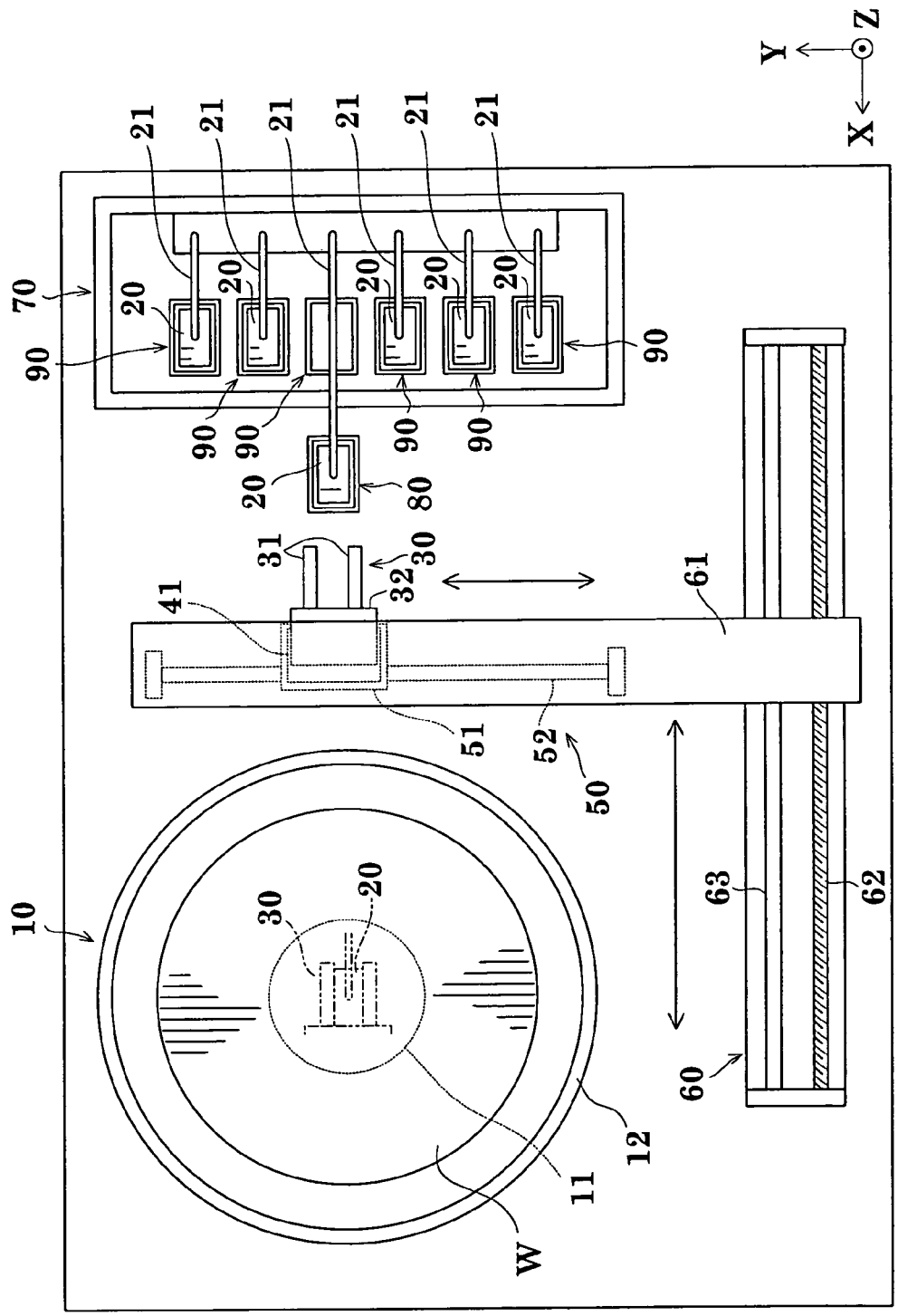
FIG. 15 is a plan view showing an outline of a spin coating apparatus which is a substrate treating apparatus in a third embodiment of the invention.

A third embodiment will be described with reference to FIG. 15. FIG. 15 is a plan view showing an outline of a spin coating apparatus which is a substrate treating apparatus in the third embodiment of the invention.

In the second embodiment described above, the standby station 70 includes six storage pots 71 each having the temperature control pot 80 and standby pot 90 arranged in two vertical stages. In the third embodiment, the standby station 70 includes six standby pots 90 only, with a single temperature control pot 80 disposed separately from the standby pots 90. Like reference numerals are used to identify like parts in the second embodiment and will not particularly be described again.

The spin coating apparatus in the third embodiment is characterized in that the single temperature control pot 80 is provided separately from the six standby pots 90.

Operation of the spin coating apparatus in the third embodiment will be described next. The standby station 70 stores six nozzles 20 connected to the treating solution sources (not shown) which supply different types of treating solution through the treating solution pipes 21. Each nozzle 20 is on standby, with the projection 25 extending through the receiving bore 91 of the standby pot 90.

As shown in FIG. 15, the nozzle gripper 30 grips one nozzle 20 selected from the six nozzles 20 on standby in the standby station 70, and places this nozzle 20 in the single temperature control pot 80. The temperature control pot 80 controls the temperature of the treating solution in the treating solution reservoir 22 of nozzle 20. After the temperature control of the treating solution in the reservoir 22 by the temperature control pot 80, the nozzle gripper 30 grips the nozzle 20 in the temperature control pot 80, and moves it to the predetermined position over the wafer W in the spin treating station 10. Then, the nozzle 20 delivers the temperature-controlled treating solution to the wafer W. After delivering the treating solution to the wafer W, the nozzle 20 is moved by the nozzle gripper 30 to the corresponding standby pot 90 in the standby station 70. The wafer W receives a predetermined treatment by the temperature-controlled treating solution.

According to the spin coating apparatus in the third embodiment, as described above, the discharge openings 25a of nozzles 20 may be kept on standby in the predetermined atmosphere in the standby pots 90, and a nozzle 20 selected for use is moved from its standby pot 90 to the temperature control pot 80. The temperature of the treating solution in the treating solution reservoir 22 may be controlled by the temperature control pot 80. There is no need to provide temperature control pots 80 corresponding in number to the standby pots 90. It is sufficient to serve the purpose if at least one temperature control pot 80 is provided. Thus, a complication of the apparatus resulting from providing the same number of temperature control pots 80 as the standby ports 90 may be avoided.

This invention is not limited to the foregoing embodiments, but may be modified as follows:

(1) In each of the foregoing embodiments, the wafer W is maintained in the fixed location while the nozzle 20 is moved. This invention is applicable also where the wafer W is moved from one location to another. Further, this invention is applicable also where the nozzle 20 and wafer W are both movable.

(2) In each of the foregoing embodiments, the standby station 70 includes six standby pots 90 for the six nozzles 20. Only one nozzle 20 or a plurality of, other than six, nozzles 20 may be provided.

(3) In each of the foregoing embodiments, as shown in FIG. 9, the cooling water circulating members 36c are arranged adjacent the Peltier elements 36b of the temperature control plates 36 in order to remove the heat generating from the Peltier elements 36b. The cooling water circulating members 36c for supplying cooling water may be replaced by a cooling gas circulating device or cooling fins.

When cooling with a device other than the cooling fins, a coolant, typically cooling water, is usually passed through coolant channels, typically the cooling water pipes 36A and cooling water drain pipes 36B, as in each of the foregoing embodiments. The coolant is not limited to cooling water, but may be a coolant in wide use which may be a gas such as flon, methylchloride or ammonia, or a liquid such as liquefied gas (e.g. liquid nitrogen).

(4) In each of the foregoing embodiments, as shown in FIG. 9, the temperature control surfaces (heat conductive members 25) of nozzle 20 are directly contacted by the temperature control plates 36. Instead, a gelatinous substance of high thermal conductivity or a magnetic fluid may be placed in an interface between the temperature control plates 36 and the temperature control surfaces of nozzle 20 contacting or adjacent each other to reduce a contact thermal resistance and to promote a heat exchange rate.

(5) In the nozzle 20 described above, the resin block 24 is a plate-like rectangular parallelepiped in shape as shown in FIG. 7. The resin block 24 may have any plate-like three-dimensional configuration such as a cube.

(6) In the nozzle 20 described above, the treating solution channel 24a in the resin block 24 extends between and opens at the front and back surfaces of the resin block 24. Instead, the treating solution channel 24a may open at only one surface of the resin block 24. In this case, the treating solution channel 24a may be formed at one surface of the resin block 24, and a heat conductive member 25 may be face-bonded to that surface to close the treating solution channel 24a. Only one heat conductive member 25 is required here as distinct from the foregoing embodiments.

Further, the treating solution channel 24a in the resin block 24 may open at the front surface and right and left side surfaces of the resin block 24. The treating solution channel 24a may open at the front surface and one of the right and left side surfaces of the resin block 24. That is, the treating solution channel 24a may be formed in the resin block 24 to open at least at one lateral surface of the resin block 24.

Figure 16A:
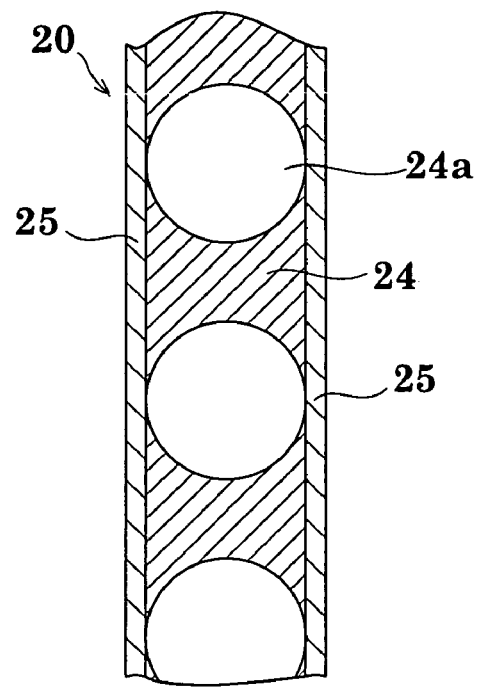
FIG. 16A is a sectional view of a modified treating solution reservoir.
Figure 16B:
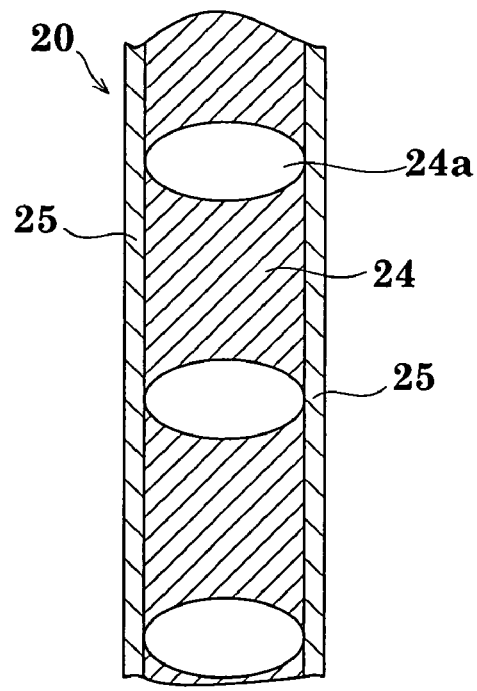
FIG. 16B is a sectional view of another modified treating solution reservoir.

(7) As shown in FIGS. 8A and 8D, the treating solution reservoir 22 in the foregoing embodiments is in the form of treating solution channel 24a having a rectangular section. As shown in FIGS. 16A and 16B, the treating solution channel 24a may have a circular or flattened elliptical section. However, when manufacturing the nozzle 20 it is easier to form the treating solution channel 24a having a rectangular section and extending between the front and back surfaces as in the foregoing embodiments.

(8) In each of the foregoing embodiments, as shown in FIG. 8A, the treating solution channel 24a has a meandering configuration following a winding course from top to bottom. Alternatively, as shown in FIG. 17, the treating solution reservoir 22 may include a treating solution channel 24a that directs the treating solution to a lower position, then to an upper position higher than the lower position, and again downward to be delivered from the discharge opening.

Figure 17:
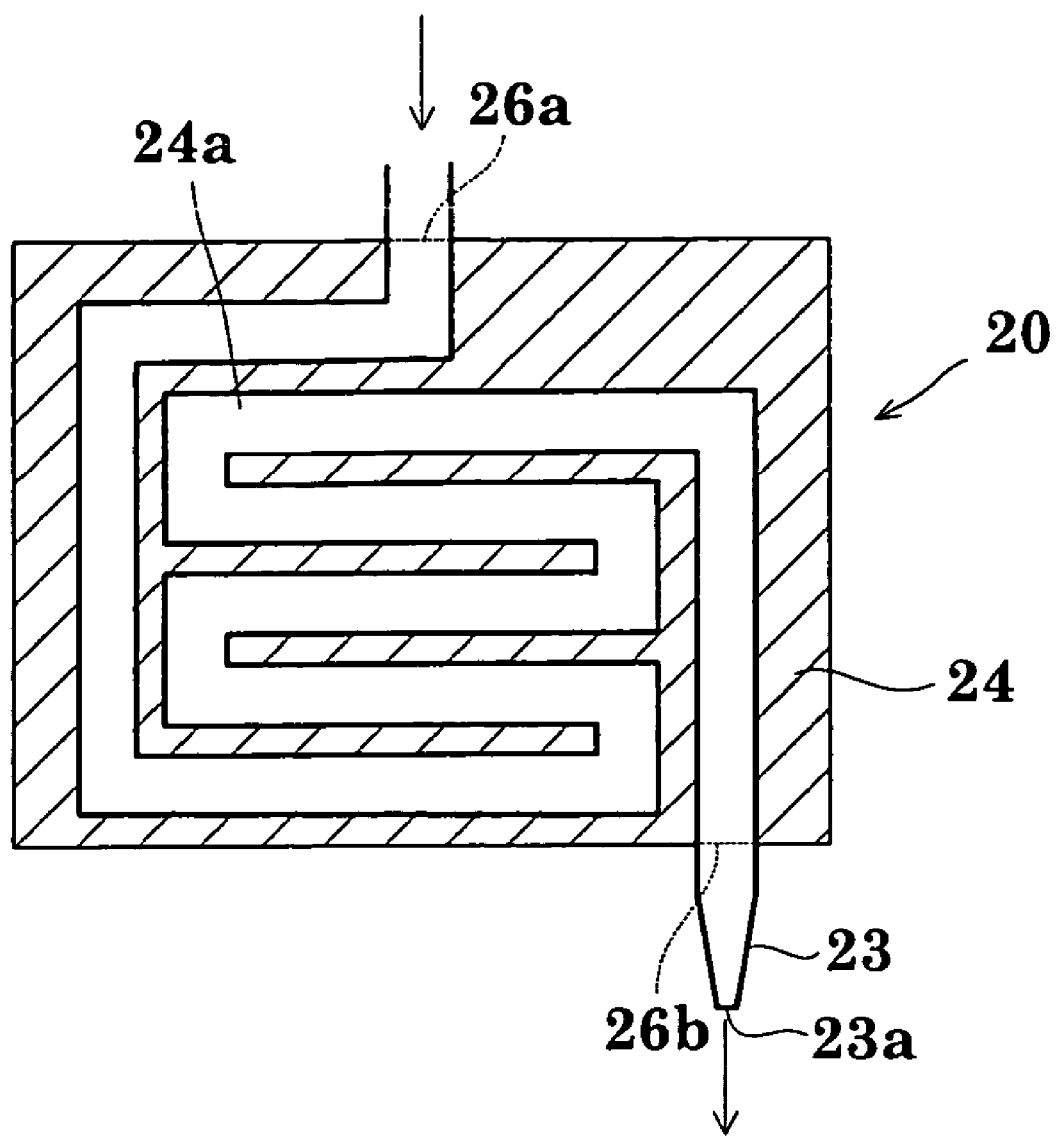
FIG. 17 is a view in vertical section of a further modified treating solution reservoir.

In the construction shown in FIG. 17, the treating solution channel 24a allows the treating solution to flow to the lower position once, and flow upward therefrom. This flow mode can supply the treating solution stably while reliably avoiding the possibility of air entering the treating solution channel 24a.

Figure 18:
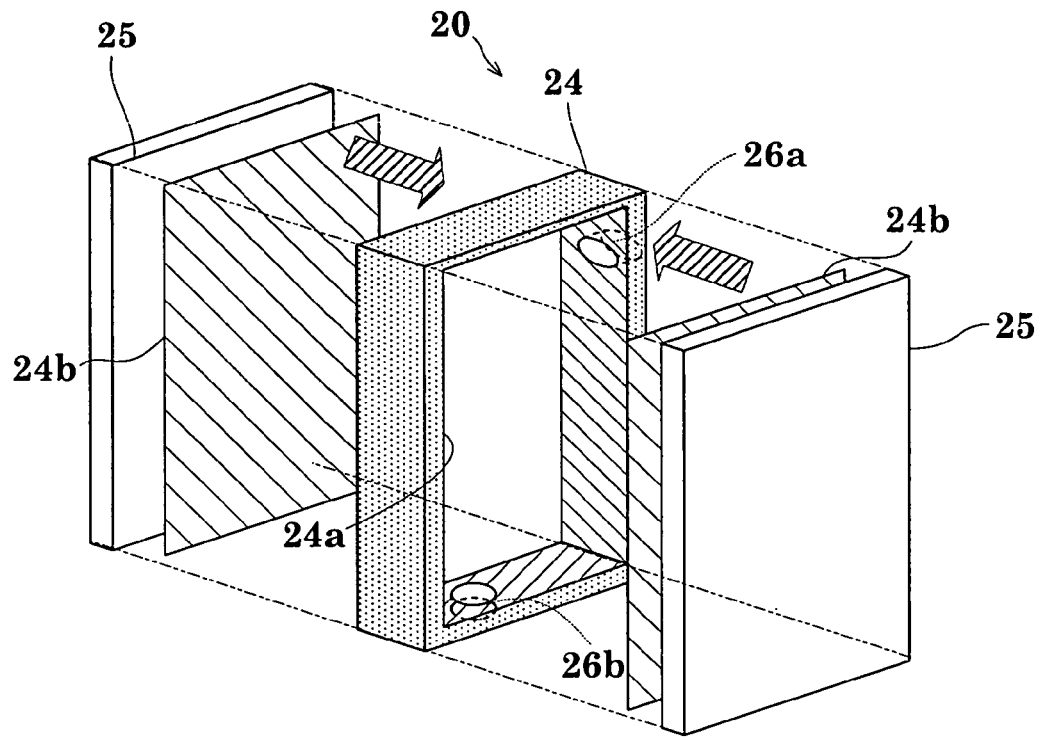
FIG. 18 is an exploded perspective view of a resin block and heat conductive members constituting a further modified nozzle.
Figure 19:
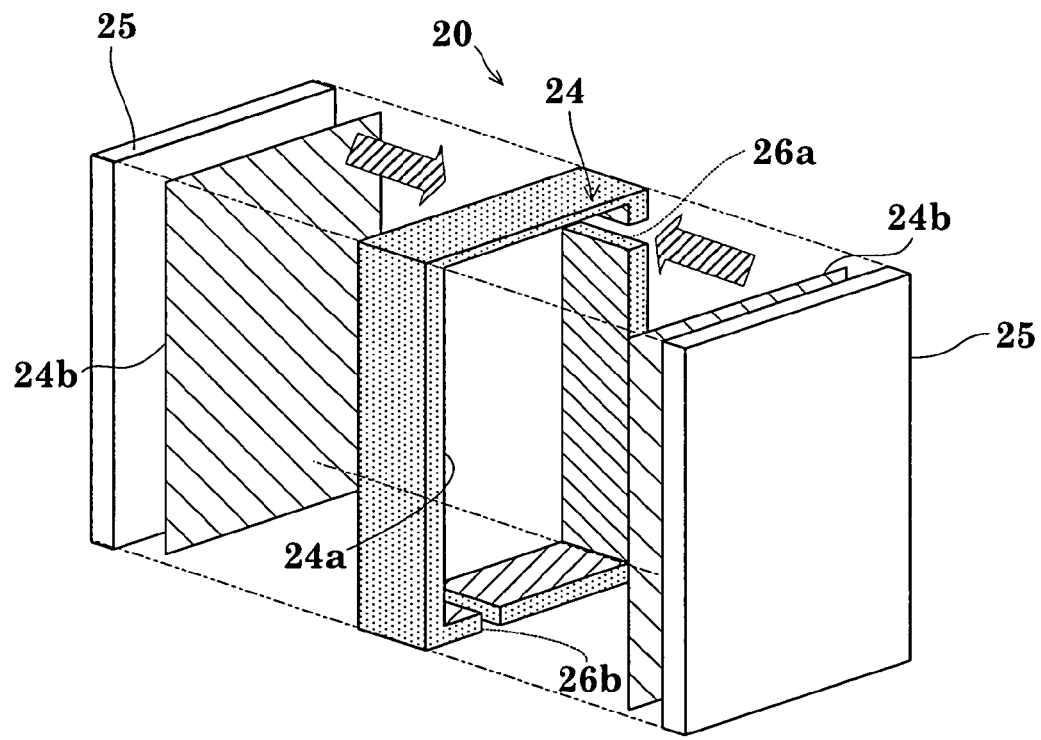
FIG. 19 is an exploded perspective view of a resin block and heat conduction members constituting a further modified nozzle.

(9) In the foregoing embodiments and in modification (8), the treating solution reservoir 22 has a meandering configuration. As shown in FIG. 18, a rectangular treating solution channel 24a may be formed to extend between large parts of the front and back surfaces of resin block 24. In this case, however, when the treating solution is introduced into the treating solution reservoir 22 for a next delivery cycle, part of the treating solution for a preceding delivery cycle could remain and mix into the newly stored treating solution. It is therefore preferable to form the treating solution reservoir 22 in the meandering configuration as shown in FIGS. 8A through 8D and 17. The supply port 26a and discharge port 26b are not limited to the upper position or lower position shown in FIG. 8. The supply port 26a and discharge port 26b may be formed in positions shown in FIG. 18, for example. As shown in FIG. 19, the supply port 26a and discharge port 26b also may extend between the front and back surfaces of the resin block 24. A similar construction may be applied where the treating solution channel 24a opens at least at one surface of the resin block 24 as in modification (6).

(10) In the foregoing nozzle 20, the resin block 24 is formed of the same PFA resin as the film-like members 24b, but need not be formed of the same resin. However, the same resin is desirable from the viewpoint of facilitating the heat fusion of the resin block 24 and film-like members 24b.

Further, the film-like members 24b disposed between the resin block 24 and two heat conductive members 25 are formed of PFA resin, but may be formed of a fluorine resin other than PFA resin. The film-like members 24b are not limited to a particular material as long as the film-like members 24b are formed of a chemical-resistant resin that prevents contamination of the treating solution and particles mixing into the treating solution. The film-like members 24b used in face-bonding the resin block 24 and two heat conductive members 25 are not limited to a chemical-resistant resin, typically PFA resin, as long as it serves for the face bonding purpose. However, for the purpose of preventing contamination of the treating solution and particles mixing into the treating solution, it is preferable to form the film-like members 24b with a chemical-resistant resin. Furthermore, the film-like members 24b are not indispensable components.

(11) Each of the foregoing embodiments has been described by taking a spin coating apparatus for example. This invention is not limited to such an apparatus, but is applicable also to a non-spin type coating apparatus. The invention is applicable to a wide variety of substrate treating apparatus that perform treatment (e.g. development, cleaning, etc.) of substrates by delivering appropriate treating solutions (e.g. a developer, rinse solution, etc.) to surfaces to be treated of the substrates.

(12) In each of the foregoing embodiments, Peltier elements are used for the temperature control plates. Instead, for example, temperature control water may be circulated around the temperature control plates.

(13) In the third embodiment, the treating solution reservoir 22 of nozzle 20 is moved into the temperature control pot 80. Conversely, to perform the temperature control, the temperature control pot 80 may be moved to a standby location of the treating solution reservoir 22 of a nozzle 20 to be used next.

(14) The temperature control plates in each of the foregoing embodiments pinch the nozzle 20 horizontally. Instead, the temperature control plates may be adapted to pinch the nozzle 20 vertically or obliquely.

The first to third embodiments or modifications (1) to (14) may be combined with modifications (15) to (30) described hereinafter.

Modifications (15) to (21) additionally provide devices for solving the problem (I) noted hereinbefore. Modifications (22) to (25) additionally provide devices for solving the problem (II) noted hereinbefore. Modifications (26) to (30) additionally provide devices for solving the problem (III) noted hereinbefore.

Further, it is to be noted that modifications (15) to (30) may employ nozzles shown in FIGS. 29 and 30A through 30D, as well as the nozzle shown in FIG. 7 which is in the form of a block member, typically resin block 24, with open front and back surfaces or at least one open surface.

Figure 20:
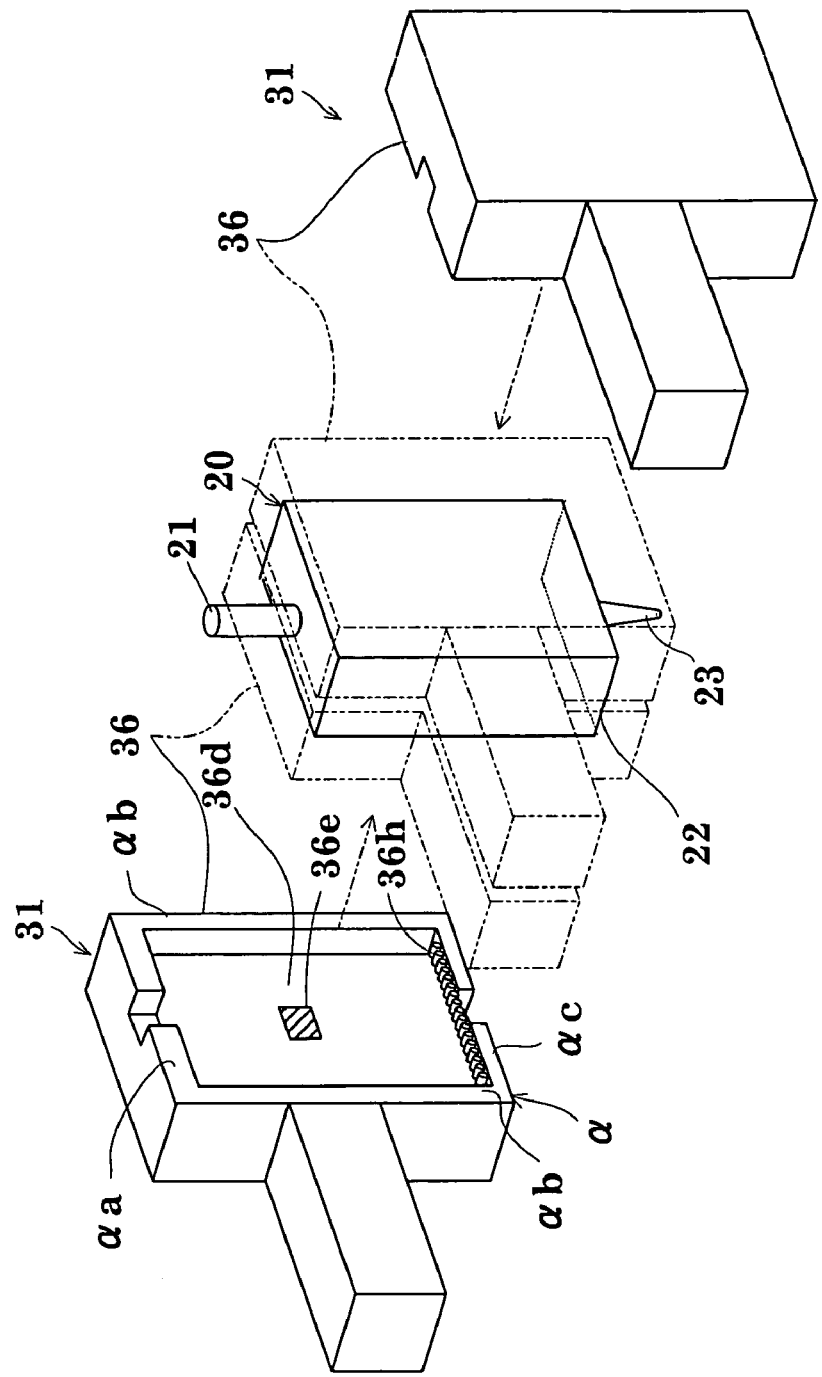
FIG. 20 is a perspective view showing a specific construction of modified temperature control plates for solving problem (I)

Problem (I):

(15) The temperature control plates are constructed as shown in FIG. 20. Pinching surfaces of the pair of temperature control plates 36 opposed to each other, i.e. inward surfaces of the pinching plates 36a, each have a contact portion with a temperature sensor 36e, and a receiving portion α projecting from the contact portion 36d. The receiving portion α includes an upper receiving portion αa disposed above the contact portion 36d, side receiving portions αb disposed laterally of the contact portion 36d, and a lower receiving portion αc disposed below the contact portion 36d. The pair of temperature control plates 36 hold the treating solution reservoir 22 of nozzle 20 therebetween.

Specifically, as the pair of temperature control plates 36 hold the treating solution reservoir 22 between the contact portions 36d, the treating solution reservoir 22 contacts the contact portions 36d of the temperature control plates 36 to form contact surfaces extending vertically. At this time, as shown in phantom lines in FIG. 20, outer peripheries of the nozzle 20 are surrounded by the receiving portions αa, αb and αc. This arrangement effectively prevents outward scattering of dust generating from the contact surfaces between the nozzle 20 and the contact portions 36d, thereby reducing the chance of the dust adhering to the substrate.

More particularly, the upper receiving portions αa and side receiving portions αb prevent dust from scattering upward and sideways of the nozzle 20, while the lower receiving portions αc disposed below the contact surfaces between the nozzle 20 and contact portions 36d prevent dust generating from the contact surfaces between the nozzle 20 and contact portions 36d from falling downward from the nozzle 20. When the nozzle 20 is held between the pair of temperature control plates 36 as shown in the phantom lines in FIG. 20, the receiving portions α, preferably, have a predetermined small distance therebetween instead of contacting each other. With this construction, the receiving portions α are maintained out of contact with each other so as not to generate dust, and the dust generating from the contact surfaces between the nozzle 20 and contact portions 36d is suppressed from scattering outward.

In time of temperature control operation, the pair of temperature control plates 36 pinch the treating solution reservoir 22 of the nozzle 20 therebetween with a predetermined pressing force. That is, the contact portions 36d of temperature control plates 36 are placed in contact with the front plate 23a and back plate 23b of the treating solution reservoir 22 with increased contact pressure, to control the temperature of the treating solution in the treating solution reservoir 22 through heat exchange.

The control unit 88 measures the temperature of the treating solution in the treating solution reservoir 22 with the temperature sensors 36e, and drives Peltier elements 36d of the temperature control plates 36 according to the result of measurement, to adjust the temperature of the treating solution in the treating solution reservoir 22 to a predetermined temperature.

The pair of contact portions 36d have a plurality of cylindrical exhaust ports 36h for exhausting spaces formed between the nozzle 20 and temperature control plates 36. The exhaust ports 36h are arranged below the contact surfaces of the front plate 23a and back plate 23b of the treating solution reservoir 22 and the contact portions 36d. The exhaust ports 36h may be in the form of slits. The exhaust ports 36h correspond to the exhaust outlets in this invention. All the spaces formed by the nozzle 20 and temperature control plates 36 correspond to the spaces formed by the treating liquid supply nozzle and the temperature control devices.

According to this modification (15), the temperature control is carried out with the nozzle 20 and temperature control plates 36 contacting each other along vertical planes as shown in FIG. 20. The receiving portions α receive dust generating from the contact surfaces extending vertically. With the receiving portions α receiving the dust, the dust has a reduced chance of adhering to the wafer W and to the scatter preventive cup 12 located below the nozzle 20 in movement. This reduction of dust allows substrate treatment to be performed with high accuracy.

The lower receiving portions αc of the receiving portions α located below the contact portions 36d receive the dust generating and falling from the above contact surfaces. Thus, the dust generating from the contact surfaces of the nozzle 20 and the contact portions 36d of temperature control plates 36 is reliably prevented from further falling and adhering to the wafer W and the like.

In modification (15), the receiving portions α not only are disposed below the contact surfaces of the treating solution reservoir 22 of nozzle 20 and the contact portions 36d of temperature control plates 36, but hold the nozzle 20 in a way to contain the treating solution reservoir 22 in the contact portions 36d of the temperature control plates 36. Thus, the dust generating from the above contact surfaces is prevented from scattering also otherwise than downward, e.g. from scattering sideways. Further, an extended range of the treating solution reservoir 22 of nozzle 20 is enclosed to shield off external atmosphere reliably. This realizes an increased accuracy of temperature control of the treating solution in the nozzle 20.

The plurality of exhaust ports 36h serve to exhaust and remove the dust generating from the contact surfaces of the nozzle 20 and temperature control plates 36 and present in the spaces formed by the nozzle 20 and temperature control plates 36. Thus, the dust generating from the contact surfaces of the nozzle 20 and temperature control plates 36 is reliably prevented from falling and adhering to the wafer W, scatter preventive cup 12 and so on. With the plurality of exhaust ports 36h arranged below the contact surfaces of the front plate 23a and back plate 23b of treating solution reservoir 22 and the contact portions 36d, the dust generating and falling from the contact surfaces of the nozzle 20 and temperature control plates 36 may be exhausted and removed with increased effect.

The above modification (15) may be further modified as set out in the following modifications (16) to (21):

(16) In modification (15), each temperature control plate and receiving portion are formed integrally, that is, the receiving portion forms part of the temperature control plate. As shown in FIGS. 21A and 21B, the receiving portion α (in this case, lower receiving portion αc) may be spaced from the nozzle 20 and temperature control plates 36. When a temperature control is performed during movement, the lower receiving portion αc is moved with the nozzle 20 and temperature control plates 36. Not only the lower receiving portion αc but, for example, the upper receiving portion αa may be spaced apart. Each temperature control plate 36 and receiving portion α may be formed separately and placed in contact with each other.

(17) In modification (15), the receiving portions are constructed to surround the peripheries of the nozzle 20. As shown in FIG. 21B, the receiving portions α may be constructed not to surround the entire peripheries of the nozzle 20. In addition, as shown in FIG. 21C, one of the temperature control plates 36 may be bent to an L-shape, with the lower, horizontal part thereof acting as receiving portion αc. (18) In modification (15), each temperature control plate and receiving portion are formed integrally. As shown in FIG. 21D, the nozzle 20 and receiving portion a may be formed integrally.

(19) In modification (15), as shown in FIG. 20, the receiving portions αa, αb and αc surround the peripheries of the treating solution reservoir 22 of nozzle 20, but this is not limitative. For example, each contact portion 36d may have at least the lower receiving portion αc to serve the purpose. Or at least the receiving portion αc may be provided below the contact surfaces of the nozzle 20 and the contact portions 36d of temperature control plates 36. For example, any of the constructions shown in FIGS. 21A through 21D may be employed.

(20) Modification (15) provides the exhaust ports, but these exhaust ports are not absolutely necessary. However, it is preferable to provide the exhaust ports with a view to reducing the dust received by the receiving portions for reliably reducing the chance of the dust adhering to the wafer W.

(21) Modification (15) provides a plurality of exhaust ports 36h, but only one exhaust port may be provided. Further, the exhaust ports 36h have been described as forming part of the contact portions 36d of temperature control plates 36. The invention is not limited to this arrangement, but exhaust ports may be disposed in any position of temperature control plates 36 as long as they exhaust the spaces formed by the nozzle 20 and temperature control plates 36. The exhaust ports may be formed in the nozzle 20 for exhausting the spaces formed by the nozzle 20 and temperature control plates 36. The exhaust ports may be formed in both the nozzle 20 and temperature control plates 36.

Preferably, for example, the spaces formed by the nozzle 20 and temperature control plates 36 are exhausted by a switch valve mounted in an exhaust pipe to be opened and closed by a switching controller, thereby performing an ON/OFF control of the exhaust. Specifically, the switching controller may operate the switch valve to execute exhausting steps only during movement of the nozzle 20 or periodically.

Figure 22A:
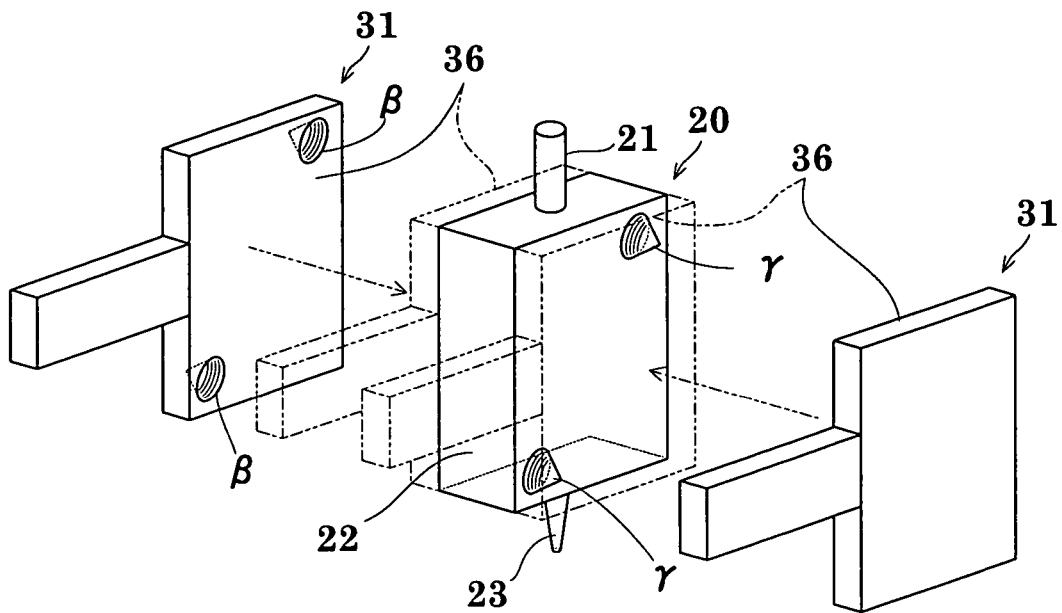
FIG. 22A is a perspective view showing a specific construction of modified temperature control plates for solving problem (II)
Figures 22B, 22C:
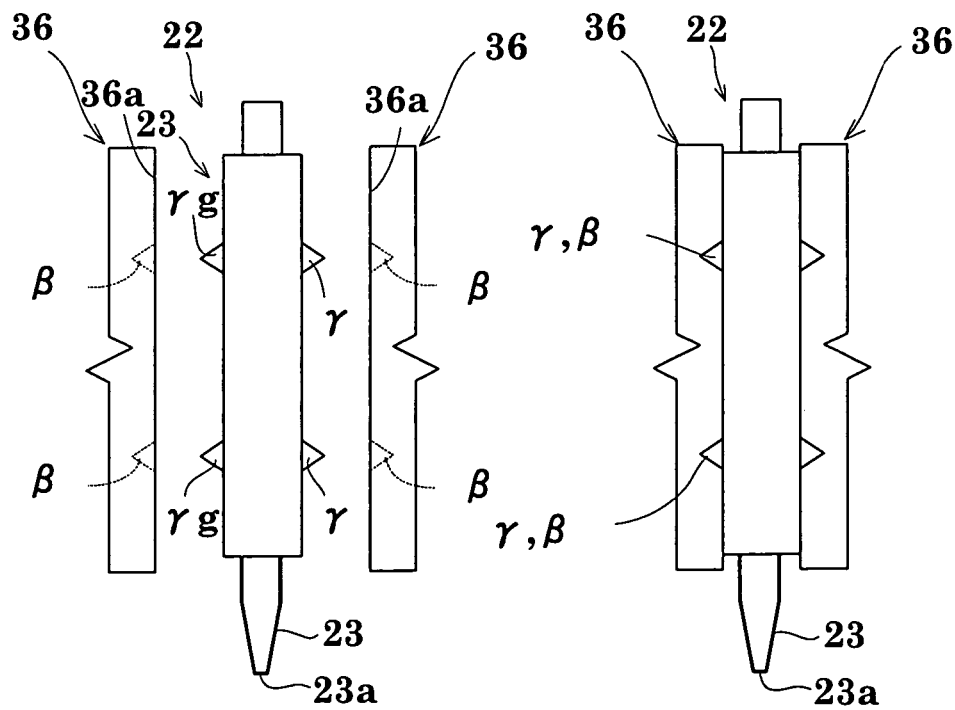
FIG. 22B is a side view of the temperature control plates shown in FIG. 22A, before holding a treating solution reservoir of a nozzle.
FIG. 22C is a side view of the temperature control plates shown in FIG. 22A, holding the treating solution reservoir of the nozzle.

Problem (II):

(22) The temperature control plates are constructed as shown in FIGS. 22A through 22C. FIG. 22A is a perspective view showing a specific construction of modified temperature control plates 36. FIG. 22B is a side view of the temperature control plates 36 before holding the treating solution reservoir 22 of the nozzle 20. FIG. 22C is a side view of the temperature control plates 36 holding the treating solution reservoir 22 of the nozzle 20. The pinching surfaces of the pair of temperature control plates 36 opposed to each other, i.e. inward surfaces of the pinching plates 36a, each have two recesses β (FIGS. 22A-22C). The heat exchange portions (i.e. the heat conductive members 25 shown in FIG. 7) of the treating solution reservoir 22 each have two projections γ formed in positions corresponding to the recesses β when the treating solution reservoir 22 of nozzle 20 is pinched between the temperature control plates 36 (FIGS. 22A-22C).

The recesses β and projections γ constitute the mating device in this invention for joining the nozzle 20 and temperature control plates 36. As shown in FIG. 22C, a relative position between the nozzle 20 and temperature control plates 36 is determined by the mating device joining the nozzle 20 and temperature control plates 36. Thus, the recesses β and projections y constitute also the positioning mechanism in this invention.

According to this modification (22), the recesses β are formed in the pinching plates 36a, and the projections γ on the heat conductive members 25 (FIG. 7), to act as the positioning mechanism in this invention for determining a relative position between the nozzle 20 and temperature control plates 36, thereby suppressing a displacement between the nozzle 20 and temperature control plates 36. This is effective to improve the efficiency of heat exchange and the accuracy of temperature control. The treating solution may be supplied at a desired temperature to the wafer W for accurate substrate treatment.

In modification (22), the positioning mechanism in this invention is formed of the mating device for joining the nozzle 20 and temperature control plates 36 together. The mating device includes the recesses β formed in the pinching plates 36a, and projections γ formed on the heat conduction members 25 (FIG. 7). A relative position between the nozzle 20 and temperature control plates 36 is determined by the mating device joining the nozzle 20 and temperature control plates 36.

The above modification (22) may be further modified as set out in the following modifications (23) to (25):

(23) In modification (22), as shown in FIGS. 22B and 22C, the projections are pointed and the recesses are shaped to fit with the pointed projections. As shown in FIG. 23A, the projections may be in the form of raised planes and the recesses shaped to fit therewith. In modification (22), the projections γ are formed on the nozzle 20 (heat conductive members 25 of nozzle 20 [FIG. 7]) and the recesses β in the temperature control plates 36 (pinching plates 36a). As shown in FIG. 23B, the recesses may be formed in the nozzle 20 and the projections on the temperature control plates 36. That is, the recesses may be formed in either the nozzle 20 or temperature control plates 36, with the projections formed on whichever not forming the recesses. The invention is not limited to a particular number or positions of recesses and projections.

(24) In modification (22), the positioning mechanism in this invention is not limited to the mating device. As shown in FIG. 23C, for example, plate-shaped magnets δ may be arranged on the nozzle 20 (heat conductive members 25 of nozzle 20 [FIG. 7]) and temperature control plates 36 (pinching plates 36a). When the pair of temperature control plates 36 pinch the nozzle 20 therebetween, the magnets δ on the nozzle 20 and the magnets δ on the temperature control plates 36 stick to each other through magnetic attraction. This determines a relative position between the nozzle 20 and temperature control plates 36. Preferably, the treating solution under temperature control is the type not influenced by magnetic attraction. Magnets δ correspond to the members having magnetic attraction in this invention.

The invention is not limited to the construction in which the nozzle 20 and temperature control plates 36 both have magnets δ. The nozzle 20 or temperature control plates 36 may have a magnetic material, typically iron, with the other having magnets.

The nozzle 20 may include members having magnetic attraction, while the temperature control plates 36 are formed integral with members having magnetic attraction. The nozzle 20 may be formed integral with members having magnetic attraction, while the temperature control plates 36 include members having magnetic attraction. The nozzle 20 may be formed integral with members having magnetic attraction, while the temperature control plates 36 also are formed integral with members having magnetic attraction. The term "(be) formed integral" refers to a construction where the members having magnetic attraction form part of the nozzle 20 or temperature control plates 36. Where the treating solution is the type not influenced by magnetic attraction, the nozzle 20 or temperature control plates 36 may, of course, be entirely formed of a member or members having magnetic attraction.

(25) In modification (22), the positioning mechanism in this invention is not limited to the mating device or magnetic material. As shown in FIG. 23D, one of the temperature control plates 36 may be bent to an L-shape, with the lower, horizontal part thereof forming an extension ε to act as the positioning mechanism. The extension ε supports the nozzle 20 from below to determine a relative position between the nozzle 20 and temperature control plates 36. The extension ε may be an integral part of the temperature control plate 36, or may be formed separately from and attached to the temperature control plate 36. Both temperature control plates 36 may be bent to the L-shape to define two extensions ε for supporting the nozzle 20 from below.

As shown in FIG. 23E, the nozzle 20 may be bent to an inverted T-shape, with the lower, horizontal part thereof forming an extension ε. In this case, the pair of temperature control plates 36 are supported from below by this extension ε, to determine a relative position between the nozzle 20 and temperature control plates 36. The extension ε may be an integral part of the nozzle 20, or may be formed separately from and attached to the nozzle 20. Thus, the extension ε may be provided for the nozzle 20 or temperature control plate(s) 36.

The extension δ provided as described above receives the dust generating from the contact surfaces of the nozzle 20 and temperature control plates 36. This feature has an additional advantage of reducing the chance of the dust adhering to the wafer W and so on, thereby performing substrate treatment with high accuracy.

Figure 24:
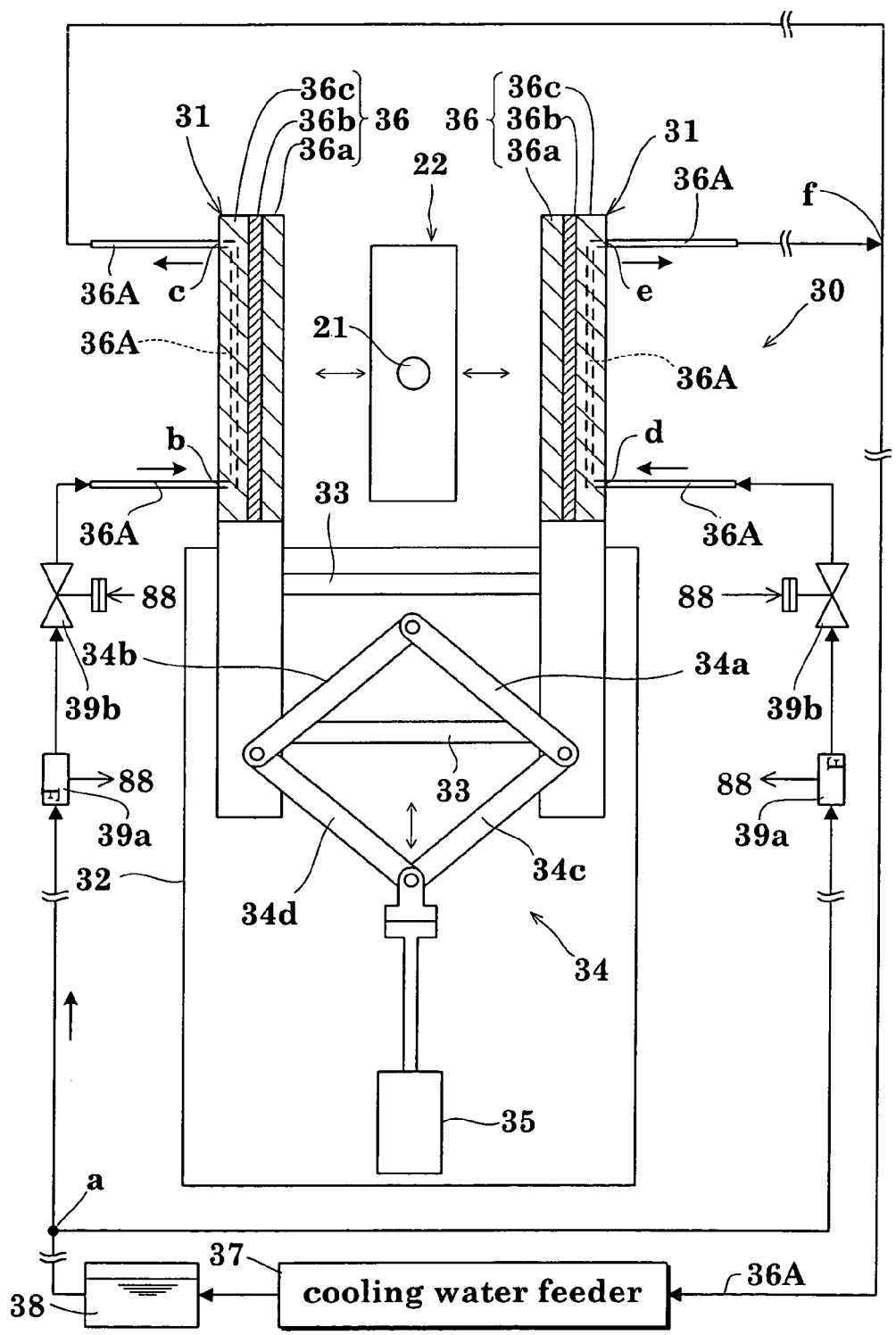
FIG. 24 is a plan view showing an outline of a modified nozzle gripper for solving problem (III)

Problem (III):

(26) The nozzle gripper is constructed as shown in FIG. 24. As in the first embodiment, the nozzle gripper 30 includes a pair of gripping arms 31. The gripping arms 31 have temperature control plates 36, respectively. As in the first embodiment, the pair of temperature control plates 36 have pinching plates 36a attached to opposed surfaces thereof, and Peltier elements 36b attached to non-pinching surfaces of the pinching plates 36a to act as thermoelectric cooling elements. As in the first embodiment, the Peltier elements 36b have cooling water circulating members 36c arranged on surfaces thereof facing away from the pinching plates 36a.

Each cooling water circulating member 36c has cooling water piping 36A for passing cooling water. The cooling water piping 36A extends outside the cooling water circulating members 36c, and is branched into two lines outside. With this construction, cooling water is supplied in parallel to the cooling water circulating members 36c of the pair of temperature control plates 36. The cooling water piping 36A is arranged such that parts of the cooling water supplied to the respective cooling water circulating members 36c of the pair of temperature control plates 36 are drained from the cooling water circulating members 36c and join each other outside the cooling water circulating members 36c. The cooling water piping 36A extending outside is connected to a cooling water feeder 37 disposed outside.

The cooling water piping 36A has a branch point "a", a supply port "b" of the cooling water to one of the cooling water circulating members 36c, a drain port "c" of the cooling water from this cooling water circulating member 36c, a supply port "d" to the other cooling water circulating member 36c, a drain port "e" of the cooling water from the other cooling water circulating member 36c, and a confluence point "f". The cooling water flows through the cooling water piping 36A as follows. The cooling water flowing from the cooling water feeder 37 is divided into two parts at the branch point "a". One part of the water flows through the supply port "b" and drain port "c" of the one cooling water circulating member 36c to the confluence point "f". The other part of the water flows through the supply port "d" and drain port "e" of the other cooling water circulating member 36c to the confluence point "f". The two parts of the cooling water joining at the confluence point "f" flow to the cooling water feeder 37. In this way, the cooling water circulates through the cooling water circulating members 36c and cooling water feeder 37. The pinching plates 36a correspond to the temperature control members in this invention. The Peltier elements 36b correspond to the thermoelectric cooling elements in this invention. The cooling water circulating members 36c correspond to the cooling members in this invention. The cooling water piping 36A corresponds to the coolant passage in this invention.

Considering that a thermal influence is given in the same condition to the cooling water circulating members 36c, Peltier elements 36b and pinching plates 36a, it is preferable to arrange the cooling water piping 36A such that the distance between the branch point "a" and one supply port "b" is substantially the same as the distance between the branch point "a" and the other supply port "d". Considering that a thermal influence is given in the same condition to the cooling water circulating members 36c, Peltier elements 36b and pinching plates 36a, and considering a temperature adjustment of the cooling water described hereinafter, it is preferable to arrange the cooling water piping 36A such that the distance between one drain port "c" and confluence point "f" is substantially the same as the distance between the other drain port "e" and confluence point "f".

A constant temperature bath 38 is disposed between the cooling water feeder 37 and branch point "a". The constant temperature bath 38 serves for setting the cooling water to a predetermined temperature, under control of the control unit 88 (FIGS. 5 and 24). In modification (26), preferably, the temperature of the cooling water is set to 15 to 23° C. when a target temperature of the treating solution is in a range of (20+0.03) to (20×0.03)° C., and the temperature of the cooling water is set to 19 to 30° C. when a target temperature of the treating solution is in a range of (26+0.03) to (26×0.03)° C. (see FIGS. 28A and 28B). The constant temperature bath 38 corresponds to the constant temperature adjusting device in this invention.

Between the branch point "a" and each of the supply ports "b" and "d", a flowmeter 39a and a switch valve 39b are arranged in order from the branch point "a". The flowmeter 39a detects a flow rate of the cooling water, and transmits a result of detecting the flow rate to the control unit 88. The control unit 88 transmits the result of detecting the flow rate to the switch valve 39b, and controls the switch valve 39b to adjust the flow rate of the cooling water based on the result of detecting the flow rate. For reducing a temperature difference between the temperature control plates 36, the flow rate of the cooling water is controlled to be in a range of 0.1 to 2.0 lit. per minute, preferably in a range for 0.3 to 1.0 lit. per minute. The flowmeter 39a corresponds to the flow rate detecting device in this invention. The switch valve 39b corresponds to the flow adjusting device in this invention.

To describe the temperature control more particularly, the control unit 88 controls the constant temperature bath 38 to set the cooling water in the constant temperature bath 38 to a predetermined temperature. On the other hand, the cooling water flowing from the cooling water feeder 37 through the cooling water piping 36A is divided at the branch point "a", to be supplied in parallel to the supply ports "b" and "d" of the cooling water circulating members 36c. The cooling water flowing through the cooling water piping 36A in the cooling water circulating members 36c is discharged through the drain ports "c" and "e". The two parts of the water are joined at the confluence point "f" to be circulated to the cooling water feeder 37.

When the cooling water has been stabilized to the predetermined temperature by the constant temperature bath 38, and the flow rate of the cooling water flowing through the cooling water piping 36A is fixed, the flowmeters 39a detect the flow rate of the cooling water, and transmit the results of detecting the flow rate to the control unit 88. The control unit 88 transmits the results of detecting the flow rate to the switch valves 39b, and controls the switch valves 39b to adjust the flow rate of the cooling water based on the results of detecting the flow rate.

When the cooling water has been stabilized to a predetermined flow rate by the switch valves 39b, as described hereinbefore, the Peltier elements 36b are driven for temperature control. The Peltier elements 36b can set the pinching plates 36a to a predetermined temperature in a short time by thermoelectric cooling effect. At this time, heat is generated on the non-pinching surfaces (i.e. the surfaces opposed to the cooling water circulating members 36c). This heat is removed by the cooling water flowing through the cooling water piping 36A in the cooling water circulating members 36c. The time for performing the temperature control is not limited to the time of movement noted hereinbefore, but may be the time when the nozzle 20 is gripped during a standby.

According to modification (26), each temperature control plate 36 includes the pinching plate 36a for contacting the treating solution reservoir 22 of nozzle 20, Peltier element 36b for setting the pinching plate 36a to a predetermined temperature by thermoelectric cooling effect, and the cooling water circulating member 36c with the cooling water piping 36A through which the cooling water flows for removing the heat generating from the Peltier element 36b. By supplying the cooling water in parallel to the cooling water circulating members 36c of the respective temperature control plates 36, a thermal influence is given in the same condition to the cooling water circulating members 36c, Peltier elements 36b and pinching plates 36a of the temperature control plates 36. As a result, the temperature difference between the temperature control plates 36 may be reduced, and the temperature control plates 36 can control the temperature of the treating solution with high accuracy.

Modification (26) provides the constant temperature bath 38 for setting the cooling water to a predetermined temperature, thereby reducing variations in the temperature of the cooling water. As a result, the temperature difference between the temperature control plates 36 due to variations in the temperature of the cooling water may be reduced, and the temperature control plates 36 can control the temperature of the treating solution with high accuracy.

Modification (26) provides the flowmeters 39a for detecting the flow rate of the cooling water flowing through the cooling water piping 36A, and the switch valves 39b for adjusting the flow rate of the cooling water. Based on the results of detecting the flow rate by the flowmeters 39a, the switch valves 39b can adjust the flow rate of the cooling water to an extent not affecting the temperature difference between the temperature control plates 36 (in a range of 0.1 to 2.0 lit. per minute, preferably in a range for 0.3 to 1.0 lit. per minute). As a result, the temperature difference between the temperature control plates 36 due to the flow rate of the cooling water flowing through the cooling water piping 36A may be reduced, and the temperature control plates 36 can effect the temperature control of the treating solution with increased accuracy.

The above modification (26) may be further modified as set out in the following modifications (27) to (30):

(27) Modification (26) provides the constant temperature adjusting device in this invention, typically the constant temperature bath 38, the flow rate detecting device in this invention, typically the flowmeters 39, and the flow adjusting device in this invention, typically the switch valves 39b. However, these devices are not absolutely necessary.

Figure 25:
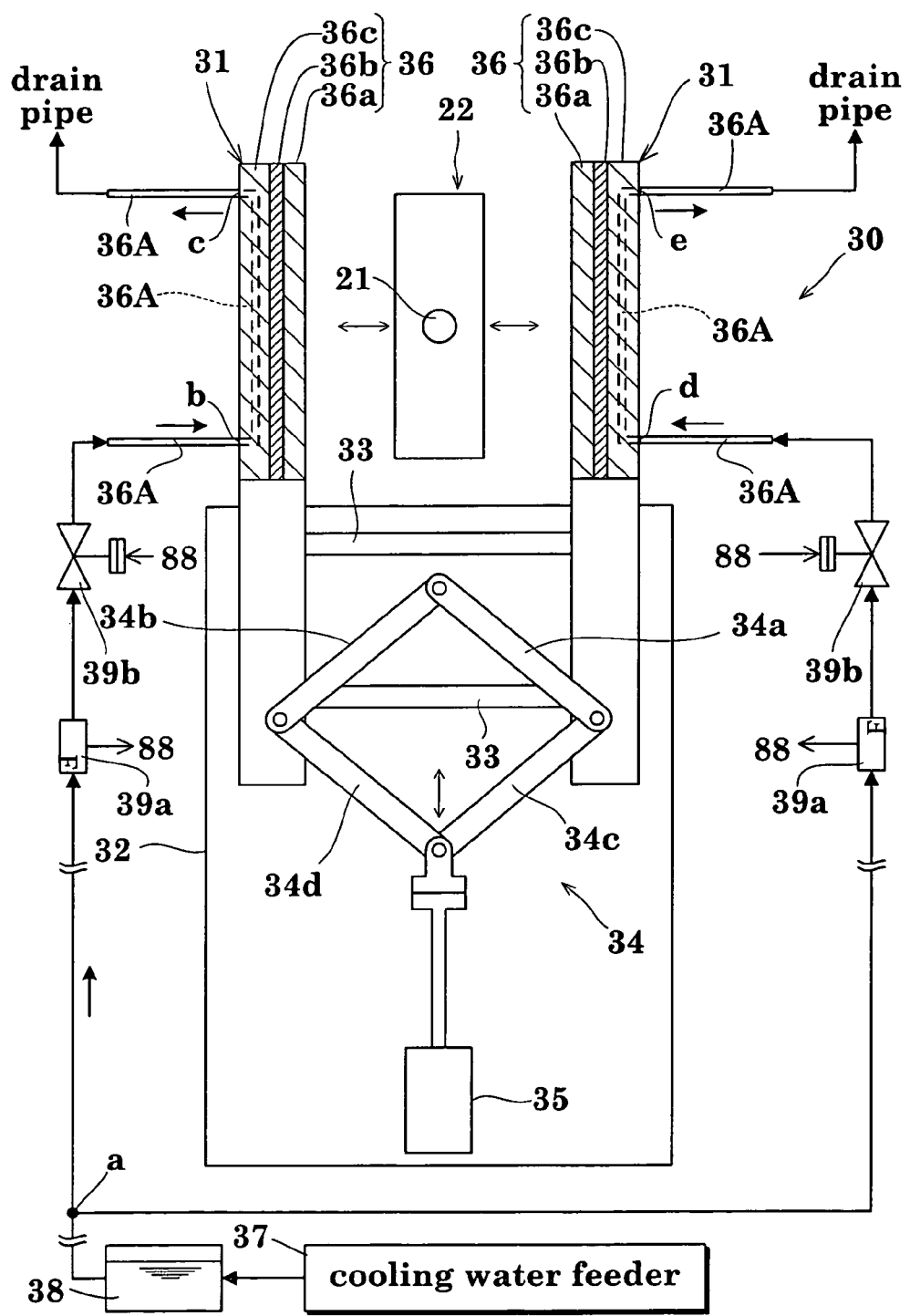
FIG. 25 is a plan view showing an outline of another modified nozzle gripper for solving problem (III)
Figure 26:
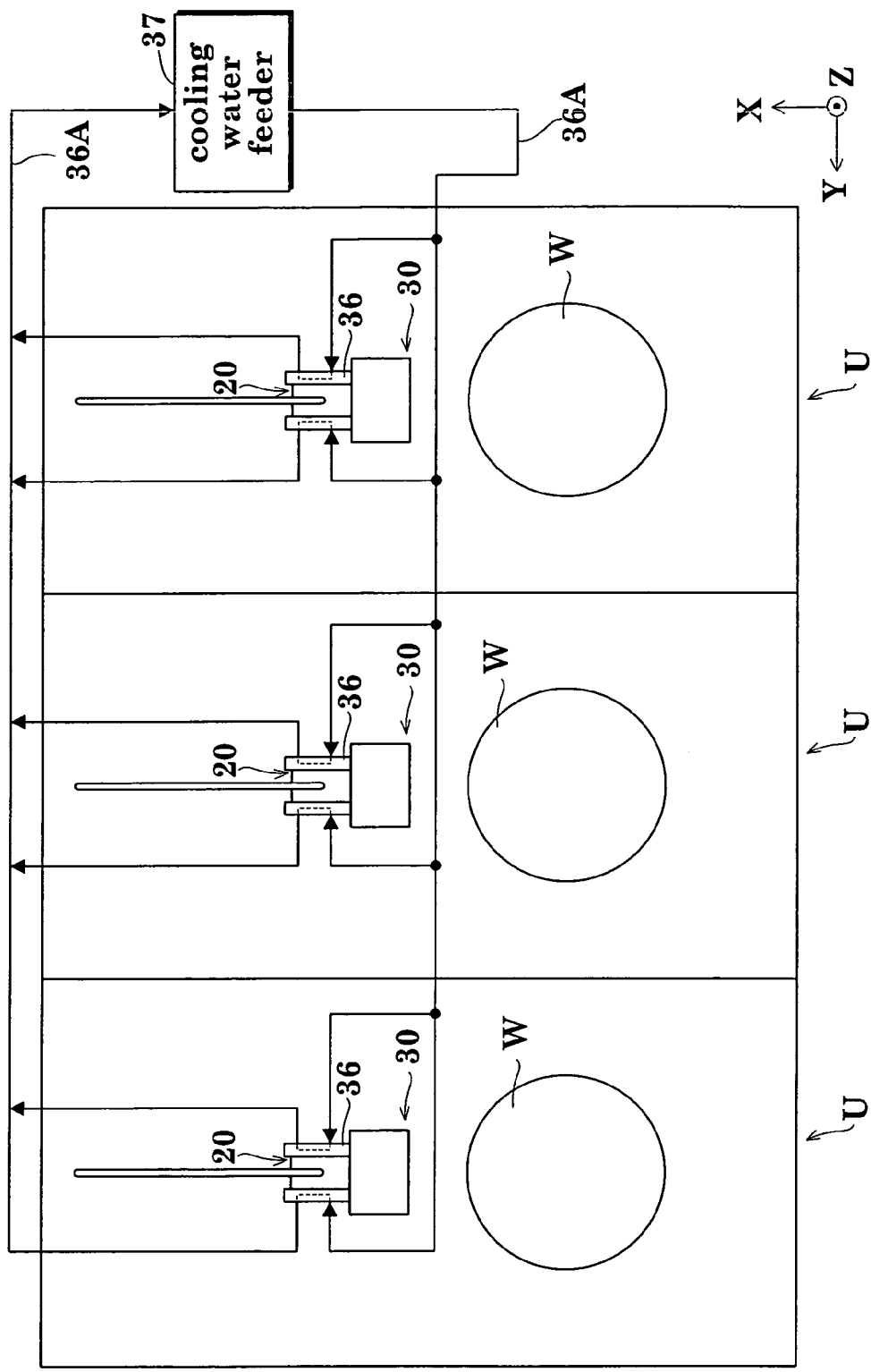
FIG. 26 is a plan view showing an outline of a modified spin coating apparatus for solving problem (III)

Conversely, for effecting the temperature control of the treating solution with high accuracy, the coolant passage in this invention, typically the cooling water piping 36A, need not be constructed to branch into a plurality of lines (two lines in modification (26)) outside, as in modification (26), to supply the coolant (cooling water in modification (26)) in parallel to the cooling members, typically the cooling water circulating members 36c. It is sufficient to provide the constant temperature adjusting device or the flow rate detecting device and flow rate adjusting device. (28) In modification (26), the cooling water piping 36A is constructed to circulate the cooling water. As shown in FIG. 25, the cooling water piping 36A may be constructed to supply the cooling water in parallel to the cooling water circulating members 36c, and thereafter communicate with drain pipes in downstream positions for draining the water. (29) Modification (26) includes only a pair of temperature control plates 36. As shown in FIG. 26, two or more pairs of temperature control plates 36 may be provided. For example, the apparatus is divided into a plurality of spin coating units U each having a pair of temperature control plates 36. Of course, one unit may have two or more pairs of temperature control plates 36.

The following advantage also is provided by the plurality of spin coating units U. Two or more pairs of temperature control plates 36 are arranged to hold nozzles 20, respectively, and cooling water piping 36A is branched to supply cooling water in parallel to the cooling water circulating members 36 (FIG. 24) of each pair of temperature control plates 36. With this construction, the cooling water is supplied in parallel to the cooling water circulating members 36c of each pair of temperature control plates 36, whereby a thermal influence is given in the same condition to the respective members 36a-36c (FIG. 24) forming each pair of temperature control plates 36. As a result, temperature differences between two or more pairs of temperature control plates 36 may be reduced. The temperature control of the treating solution can be carried out with high accuracy by the two or more pairs of temperature control plates 36.

The temperature control plates may be the type, as in the first embodiment, which performs the temperature control, during movement or standby, with the temperature control plates 36 provided for the pair of gripping arms 31 of the nozzle gripper 30 (FIG. 9), or may be the type, as in the second and third embodiments, which performs the temperature control, while the nozzle 20 is in the storage pot 71, with the temperature control plates 82 disposed in the temperature control pot 80 (FIG. 14).

(30) As described in modification (14) above, although the temperature control plates pinch the nozzle 20 horizontally, the temperature control plates may be adapted to pinch the nozzle 20 vertically or obliquely.

Figure 27:
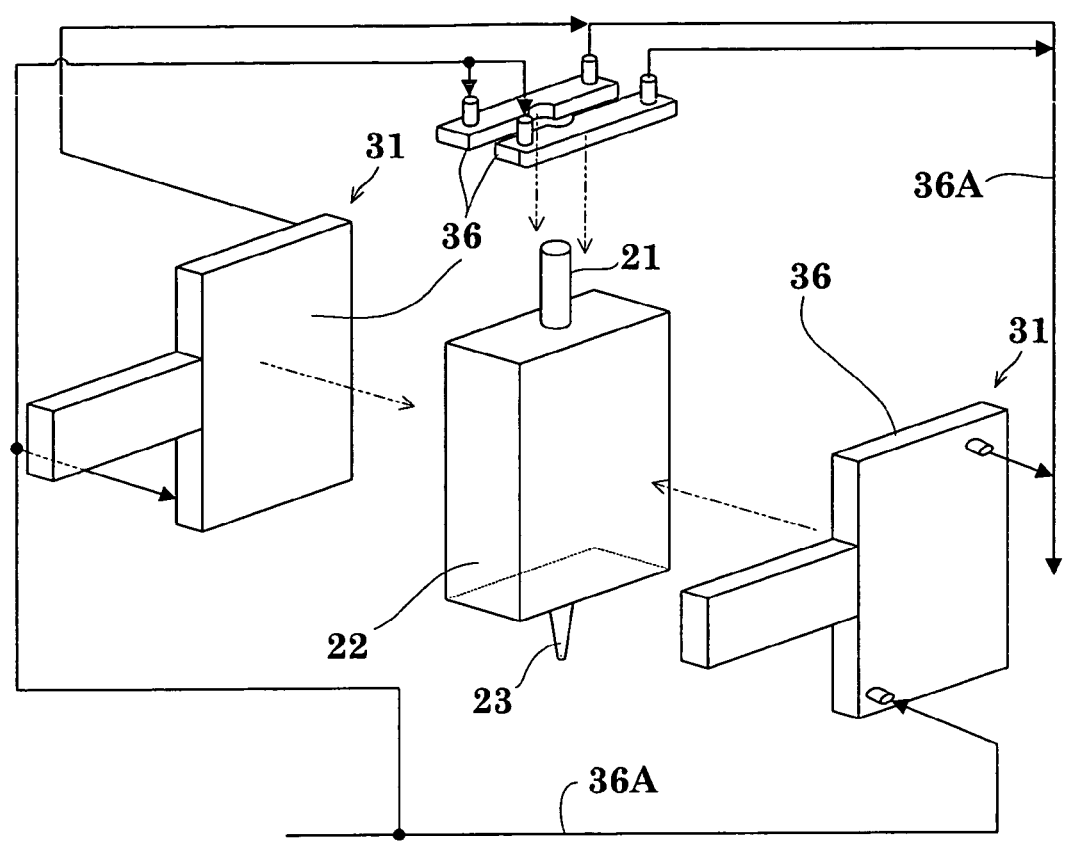
FIG. 27 is a view showing an outline of modified temperature control plates and cooling water piping for solving problem (III)
Figure 29:
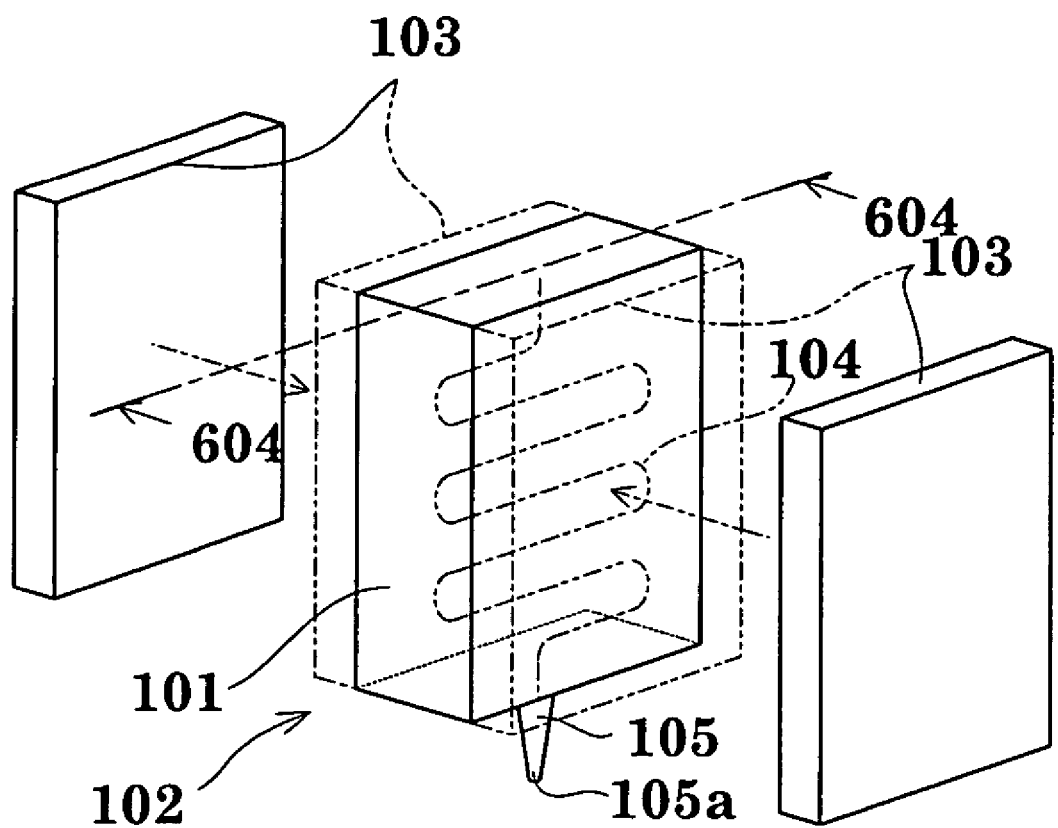
FIG. 29 is a schematic perspective view showing an outline of another nozzle and temperature control plates applicable to modifications (15)-(30)
Figure 30A:
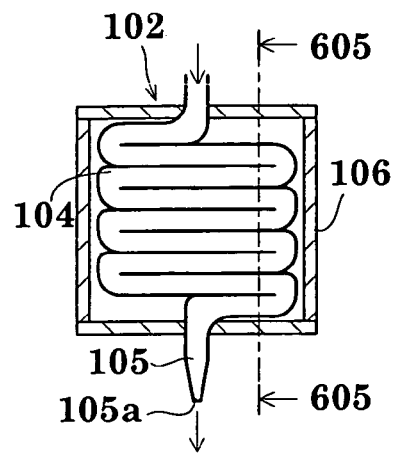
FIG. 30A is a section of the nozzle taken on line 604-604 of FIG. 29.
Figure 30B:
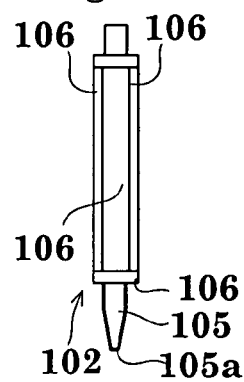
FIG. 30B is a side view of the nozzle.
Figure 30C:
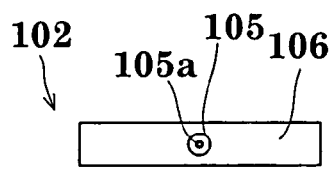
FIG. 30C is a bottom view of the nozzle.
Figure 30D:
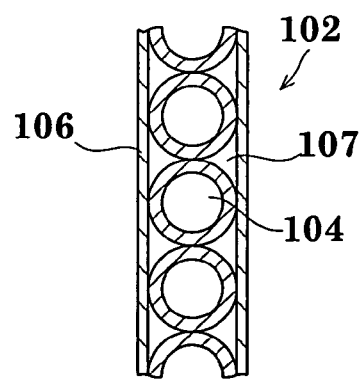
FIG. 30D is a section of the nozzle taken on line 605-605 of FIG. 30A.

The temperature control plates for pinching the nozzle 20 are not limited to two as in each embodiment. As shown in FIG. 27, while two temperature control plates 36 pinch the nozzle 20 horizontally, two other temperature control plates 36 may engage the nozzle 20 from above. The temperature control plates 36 engaging the nozzle 20 from above may be two separate members as shown in FIG. 27, or may be integrated into one member.

In this case, since four temperature control plates 36 hold the nozzle 20 for temperature control, the cooling water piping 36A is branched into four lines to supply the cooling water in parallel to the respective cooling water circulating members 36c (FIG. 24) of the temperature control plates 36. Thus, the number of lines of the coolant passage, typically the cooling water piping 36A, also is not limited to two as in each embodiment.

In the foregoing embodiments and modifications, the cooling water piping 36A is branched into a plurality of lines to supply the cooling water in parallel. Instead, the cooling water may be supplied in parallel by a plurality of cooling water pipes 36A extending from the cooling water feeder 37 and connected to the respective cooling water circulating members 36c.

As noted hereinbefore, modifications (15) to (30) are applicable not only to the nozzle shown in FIG. 7 but also to nozzles shown in FIGS. 29 and 30A through 30D, for example.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate by supplying a treating solution thereto, said apparatus comprising:
    a treating solution supply nozzle for supplying the treating solution to the substrate; and
    temperature control means for holding said treating solution supply nozzle to control temperature of the treating solution in said nozzle;
    said nozzle including:
    a block member having a channel formed therein for passage of the treating solution, said channel being open at least at one lateral surface of said block member;
    a heat conductive member face-bonded to said lateral surface of said block member for closing said channel;
    a supply port communicating with said channel for supplying the treating solution into said channel; and
    a discharge port communicating with said channel for delivering the treating solution from said channel to said substrate.

2. A substrate treating apparatus as defined in claim 1, further comprising a receiving portion for receiving dust generating from contact surfaces of said treating solution supply nozzle and said temperature control means.

3. A substrate treating apparatus as defined in claim 2, wherein said receiving portion is formed integral with one of said treating solution supply nozzle and said temperature control means.

4. A substrate treating apparatus as defined in claim 2, wherein said receiving portion is spaced from said treating solution supply nozzle and said temperature control means.

5. A substrate treating apparatus as defined in claim 2, wherein said receiving portion is constructed to surround peripheries of said treating solution supply nozzle.

6. A substrate treating apparatus as defined in claim 2, wherein at least one of said treating solution supply nozzle and said temperature control means includes exhaust outlets for exhausting spaces formed by said treating solution supply nozzle and said temperature control means.

7. A substrate treating apparatus as defined in claim 6, wherein said exhaust outlets are arranged below said contact surfaces, extending vertically, of said treating solution supply nozzle and said temperature control means.

8. A substrate treating apparatus as defined in claim 2, wherein said receiving portion is disposed at least below said contact surfaces, extending vertically, of said treating solution supply nozzle and said temperature control means.

9. A substrate treating apparatus as defined in claim 1, further comprising a positioning mechanism for determining a relative position between said treating solution supply nozzle and said temperature control means.

10. A substrate treating apparatus as defined in claim 9, wherein said positioning mechanism comprises mating means for joining said treating solution supply nozzle and said temperature control means, said mating means including recesses formed in one of said treating solution supply nozzle and said temperature control means, and projections formed on the other of said treating solution supply nozzle and said temperature control means.

11. A substrate treating apparatus as defined in claim 9, wherein said positioning mechanism comprises two members having magnetic attraction, one of said members being disposed on said treating solution supply nozzle, and the other member on said temperature control means.

12. A substrate treating apparatus as defined in claim 9, wherein said positioning mechanism comprises an extension disposed below contact surfaces of said treating solution supply nozzle and said temperature control means.

13. A substrate treating apparatus as defined in claim 1, wherein each of said temperature control means includes:
    a temperature control member arranged adjacent or in contact with said nozzle;
    a thermoelectric cooling element for setting said temperature control member to a predetermined temperature by thermoelectric cooling effect; and
    a cooling member having a coolant passage for receiving a coolant for removing heat generating from said thermoelectric cooling element;
    said coolant being supplied in parallel to said cooling members of said temperature control means.

14. A substrate treating apparatus as defined in claim 13, wherein said temperature control means are provided in a plurality of pairs for pinching said treating solution supply nozzle therebetween, said coolant being supplied in parallel to said cooling members of said temperature control means.

15. A substrate treating apparatus as defined in claim 13, further comprising constant temperature adjusting means for setting said coolant to a predetermined temperature.

16. A substrate treating apparatus as defined in claim 13, further comprising:
    flow rate detecting means for detecting a flow rate of said coolant flowing through said coolant passage; and
    flow adjusting means for adjusting the flow rate of said coolant.

17. A substrate treating apparatus as defined in claim 1, wherein each of said temperature control means includes:
    a temperature control member arranged adjacent or in contact with said nozzle;
    a thermoelectric cooling element for setting said temperature control member to a predetermined temperature by thermoelectric cooling effect; and
    a cooling member having a coolant passage for receiving a coolant for removing heat generating from said thermoelectric cooling element;

said apparatus further comprising constant temperature adjusting means for setting said coolant to a predetermined temperature.

18. A substrate treating apparatus as defined in claim 1, wherein each of said temperature control means includes:
   a temperature control member arranged adjacent or in contact with said nozzle;
   a thermoelectric cooling element for setting said temperature control member to a predetermined temperature by thermoelectric cooling effect; and
   a cooling member having a coolant passage for receiving a coolant for removing heat generating from said thermoelectric cooling element;
   said apparatus further comprising:
   flow rate detecting means for detecting a flow rate of said coolant flowing through said coolant passage; and
   flow adjusting means for adjusting the flow rate of said coolant.

19. A substrate treating apparatus for treating a substrate by supplying a treating solution thereto, said apparatus comprising:
   a treating solution supply nozzle for supplying the treating solution to the substrate; and
   temperature control means for holding said treating solution supply nozzle to control temperature of the treating solution in said nozzle;
   said nozzle including:
   a block member having a channel formed therein for passage of the treating solution, said channel extending between and opening at front and back surfaces of said block member;
   heat conductive members face-bonded to said front and back surfaces of said block member, respectively, for closing said channel;
   a supply port communicating with said channel for supplying the treating solution into said channel; and
   a discharge port communicating with said channel for delivering the treating solution from said channel to said substrate.

20. A substrate treating apparatus as defined in claim 19, further comprising a receiving portion for receiving dust generating from contact surfaces of said treating solution supply nozzle and said temperature control means.

21. A substrate treating apparatus as defined in claim 20, wherein said receiving portion is formed integral with one of said treating solution supply nozzle and said temperature control means.

22. A substrate treating apparatus as defined in claim 20, wherein said receiving portion is spaced from said treating solution supply nozzle and said temperature control means.

23. A substrate treating apparatus as defined in claim 20, wherein said receiving portion is constructed to surround peripheries of said treating solution supply nozzle.

24. A substrate treating apparatus as defined in claim 20, wherein at least one of said treating solution supply nozzle and said temperature control means includes exhaust outlets for exhausting spaces formed by said treating solution supply nozzle and said temperature control means.

25. A substrate treating apparatus as defined in claim 24, wherein said exhaust outlets are arranged below said contact surfaces, extending vertically, of said treating solution supply nozzle and said temperature control means.

26. A substrate treating apparatus as defined in claim 20, wherein said receiving portion is disposed at least below said contact surfaces, extending vertically, of said treating solution supply nozzle and said temperature control means.

27. A substrate treating apparatus as defined in claim 19, further comprising a positioning mechanism for determining a relative position between said treating solution supply nozzle and said temperature control means.

28. A substrate treating apparatus as defined in claim 27, wherein said positioning mechanism comprises mating means for joining said treating solution supply nozzle and said temperature control means, said mating means including recesses formed in one of said treating solution supply nozzle and said temperature control means, and projections formed on the other of said treating solution supply nozzle and said temperature control means.

29. A substrate treating apparatus as defined in claim 27, wherein said positioning mechanism comprises two members having magnetic attraction, one of said members being disposed on said treating solution supply nozzle, and the other member on said temperature control means.

30. A substrate treating apparatus as defined in claim 27, wherein said positioning mechanism comprises an extension disposed below contact surfaces of said treating solution supply nozzle and said temperature control means.

31. A substrate treating apparatus as defined in claim 19, wherein each of said temperature control means includes:
   a temperature control member arranged adjacent or in contact with said nozzle;
   a thermoelectric cooling element for setting said temperature control member to a predetermined temperature by thermoelectric cooling effect; and
   a cooling member having a coolant passage for receiving a coolant for removing heat generating from said thermoelectric cooling element;
   said coolant being supplied in parallel to said cooling members of said temperature control means.

32. A substrate treating apparatus as defined in claim 31, wherein said temperature control means are provided in a plurality of pairs for pinching said treating solution supply nozzle therebetween, said coolant being supplied in parallel to said cooling members of said temperature control means.

33. A substrate treating apparatus as defined in claim 31, further comprising constant temperature adjusting means for setting said coolant to a predetermined temperature.

34. A substrate treating apparatus as defined in claim 31, further comprising:
   flow rate detecting means for detecting a flow rate of said coolant flowing through said coolant passage; and
   flow adjusting means for adjusting the flow rate of said coolant.

35. A substrate treating apparatus as defined in claim 19, wherein each of said temperature control means includes:
   a temperature control member arranged adjacent or in contact with said nozzle;
   a thermoelectric cooling element for setting said temperature control member to a predetermined temperature by thermoelectric cooling effect; and
   a cooling member having a coolant passage for receiving a coolant for removing heat generating from said thermoelectric cooling element;
   said apparatus further comprising constant temperature adjusting means for setting said coolant to a predetermined temperature.

36. A substrate treating apparatus as defined in claim 19, wherein each of said temperature control means includes:
   a temperature control member arranged adjacent or in contact with said nozzle;
   a thermoelectric cooling element for setting said temperature control member to a predetermined temperature by thermoelectric cooling effect; and a cooling member having a coolant passage for receiving a coolant for removing heat generating from said thermoelectric cooling element;

said apparatus further comprising:

flow rate detecting means for detecting a flow rate of said coolant flowing through said coolant passage; and flow adjusting means for adjusting the flow rate of said coolant.

37. A substrate treating apparatus for treating a substrate by supplying a treating solution thereto, said apparatus comprising:

a treating solution supply nozzle having a discharge port for discharging and supplying the treating solution to the substrate and having no temperature control means;

temperature control means for holding said treating solution supply nozzle to control temperature of the treating solution in said nozzle;

a receiving portion for receiving dust generating from contact surfaces of said treating solution supply nozzle and said temperature control means; and a moving mechanism for moving, between a standby position and a treating solution supply position, the treating solution supply nozzle and the temperature control means, with the temperature control means being secured to a holding portion of said moving mechanism for holding the treating solution supply nozzle.

38. A substrate treating apparatus as defined in claim 37, wherein said receiving portion is formed integral with one of said treating solution supply nozzle and said temperature control means.

39. A substrate treating apparatus as defined in claim 37, wherein said receiving portion is spaced from said treating solution supply nozzle and said temperature control means.

40. A substrate treating apparatus as defined in claim 37, wherein said receiving portion is constructed to surround peripheries of said treating solution supply nozzle.

41. A substrate treating apparatus as defined in claim 37, wherein at least one of said treating solution supply nozzle and said temperature control means includes exhaust outlets for exhausting spaces formed by said treating solution supply nozzle and said temperature control means.

42. A substrate treating apparatus as defined in claim 41, wherein said exhaust outlets are arranged below said contact surfaces, extending vertically, of said treating solution supply nozzle and said temperature control means.

43. A substrate treating apparatus as defined in claim 37, wherein said receiving portion is disposed at least below said contact surfaces, extending vertically, of said treating solution supply nozzle and said temperature control means.

* * * * *